(12) United States Patent
Rubin et al.

(10) Patent No.: US 7,728,293 B2
(45) Date of Patent: Jun. 1, 2010

(54) STRUCTURES AND METHODS FOR MEASURING BEAM ANGLE IN AN ION IMPLANTER

(75) Inventors: Leonard M. Rubin, South Hamilton, MA (US); Ivan Berry, Amesbury, MA (US); Walter Class, West Newbury, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 144 days.

(21) Appl. No.: 11/947,632

(22) Filed: Nov. 29, 2007

(65) Prior Publication Data

US 2009/0140717 A1 Jun. 4, 2009

(51) Int. Cl.
*G01N 21/00* (2006.01)
(52) U.S. Cl. ..................................................... 250/309
(58) Field of Classification Search ........................ None
See application file for complete search history.

(56) References Cited

U.S. PATENT DOCUMENTS

2002/0121889 A1* 9/2002 Larsen et al. ............... 324/71.3
2007/0120074 A1* 5/2007 Rathmell et al. ........ 250/492.21

* cited by examiner

*Primary Examiner*—Charles D Garber
*Assistant Examiner*—Andre' C Stevenson
(74) *Attorney, Agent, or Firm*—Eschweiler & Associates, LLC

(57) ABSTRACT

The present invention involves an ion beam angular measurement apparatus for providing feedback for a predetermined set ion beam angle comprising an arrangement of composite pillars formed on an insulating material and wherein the composite pillars selectively allow ion beams to penetrate a first layer of a pillar, wherein resistivity measurements are taken for each of the composite pillars before and after test ion beam implantation and wherein the resistivity measurements yield information relating to an angle of the ion beam during test.

25 Claims, 14 Drawing Sheets

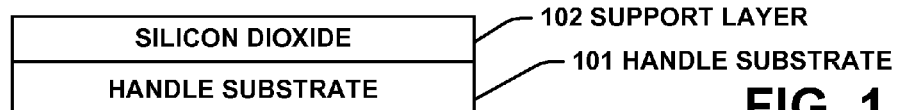
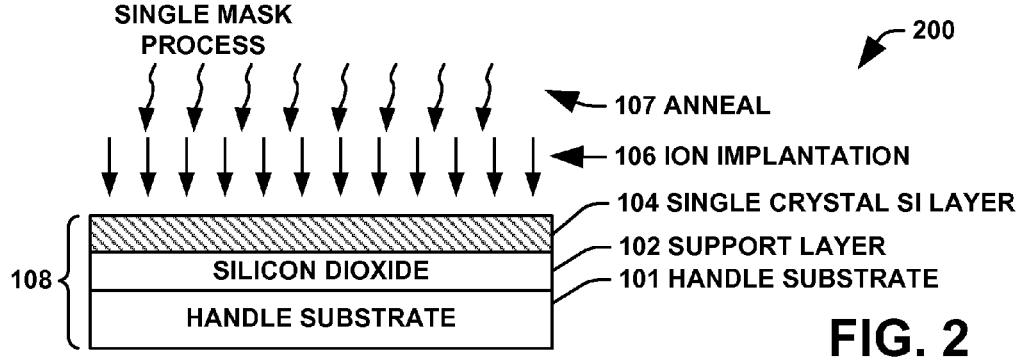
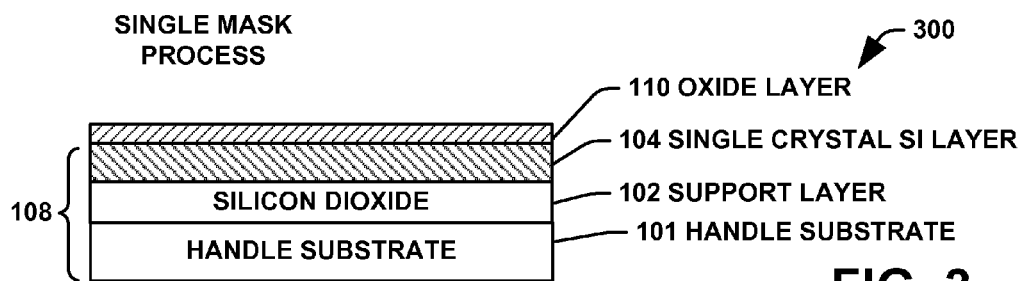
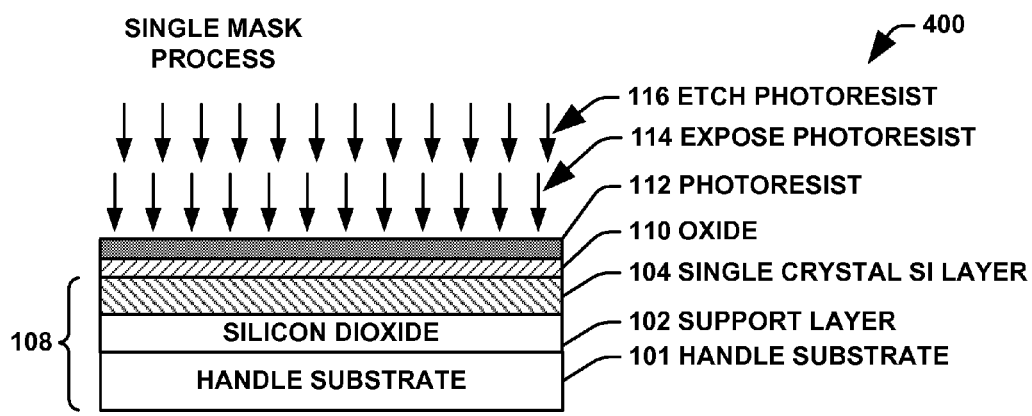

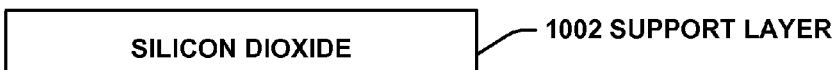
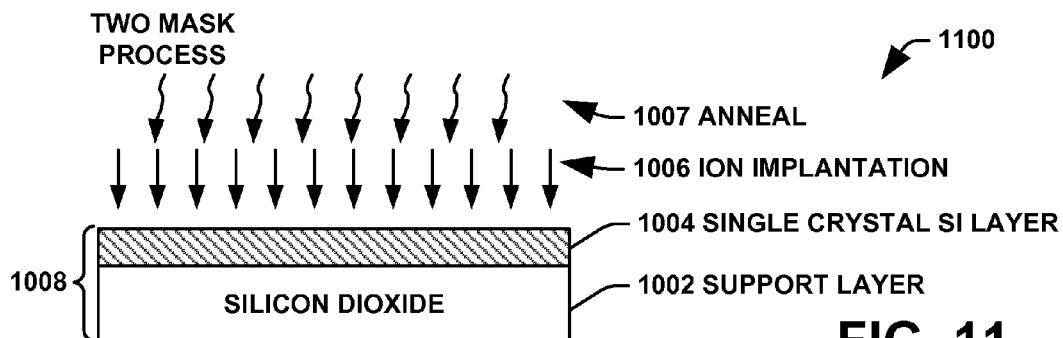
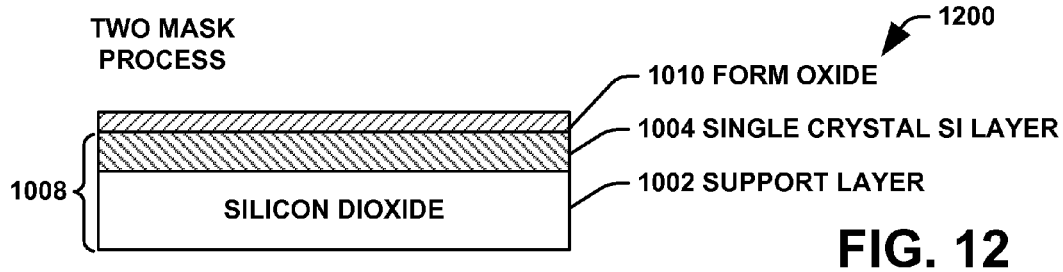
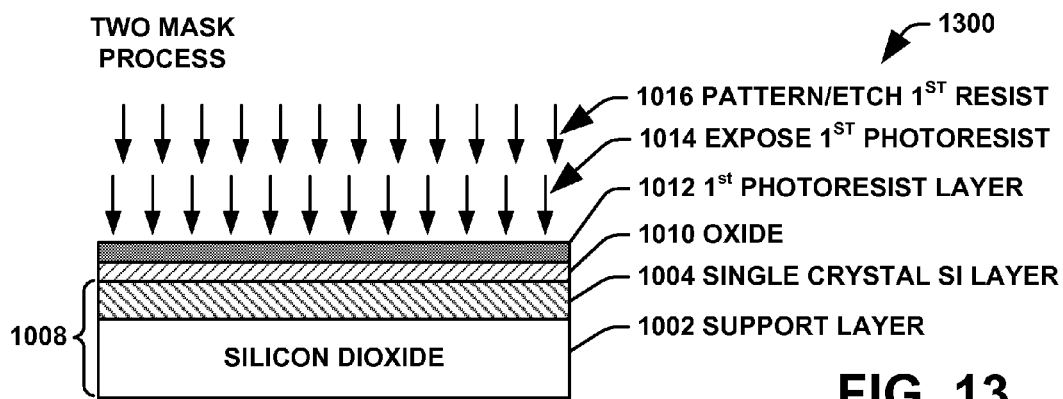

STRUCTURES AND METHODS FOR MEASURING BEAM ANGLE IN AN ION IMPLANTER

FIELD OF INVENTION

The present invention relates generally to ion implantation, and, more particularly, to a systems and methods for measuring beam angle in an ion implanter.

BACKGROUND OF THE INVENTION

Ion implantation is a physical process, as opposed to diffusion, which is a chemical process that is employed in semiconductor apparatus fabrication to selectively implant dopant into semiconductor workpieces and/or wafer material. Thus, the act of implanting does not rely on a chemical interaction between a dopant and the semiconductor material. For ion implantation, dopant atoms/molecules are ionized and isolated, sometimes accelerated or decelerated, formed into a beam, and swept across a workpiece or wafer. The dopant ions physically bombard the workpiece, enter the surface and come to rest below the surface and typically come to rest below the workpiece surface in the crystalline lattice structure thereof.

An ion implantation system is a collection of sophisticated subsystems, each performing a specific action on the dopant ions. Dopant elements, in gas or solid form, are positioned inside an ionization chamber and ionized by a suitable ionization process. In one exemplary process, the chamber is maintained at a low pressure (vacuum). A filament is located within the chamber and is heated to the point where electrons are created from the filament source, for example. The negatively charged electrons are attracted to an oppositely charged anode also within the chamber. During the travel from the filament to the anode, the electrons collide with the dopant source elements (e.g., molecules or atoms) and create a host of positively charged ions.

Generally, other positive ions are created in addition to the desired dopant ions. The desired dopant ions are selected from the ions by a process referred to as analyzing, mass analyzing, selection, or ion separation. Selection is accomplished utilizing a mass analyzer that creates a magnetic field through which ions from the ionization chamber travel. The ions leave the ionization chamber at relatively high speeds and are bent into an arc by the magnetic field. The radius of the arc is dictated by the mass and velocity of individual ions, and the strength of the magnetic field. An exit slit of the analyzer permits only one species of ions, the desired dopant ions, to exit the mass analyzer.

Continuing on, the dopant ions are directed towards a target wafer at an end station. The dopant ions, as a beam, impact the wafer with a specific beam current. In order to obtain substantially uniform apparatus characteristics, the beam is required to be substantially uniform and an angle of incidence of the beam is also required to be substantially uniform. It is advantageous to control and/or measure the beam incidence angle accurately, since the electrical characteristics of advanced apparatus are dependent on the beam incidence angle. It is often advantageous to supply beams at incidence angles other than perpendicular to the substrate plane for reasons associated with the geometry or function of the semiconductor apparatus being manufactured.

As apparatus sizes are further reduced, manufacturers require better accuracy in measurements of beam incidence angles in the ion implantation process. Prior art ion beam angular measurement techniques utilize actual angle measurement at the wafer chuck or support hardware. Advanced apparatus require ever increasing precision in the measurement of the angle of the incoming ion beam. Ion beam angle at low energies is difficult to measure using conventional metrology. Typical apparatus utilize a multitude of masks and operations to make a transistor that is sensitive to ion implantation angle.

The angular measurement is typically not made in real time but is done periodically. Angular measurement is typically performed utilizing mechanical tools, laser beams, current measurements, power measurements, etc. However, these techniques have various limitations in terms of accuracy.

For higher energy implantation (e.g., greater that 50 keV) angle can be measured fairly well utilizing the ion channeling effect to measure angle. The lower the energy is below 50 keV the less effective is the resultant angular measurement. However, there is an interest in measuring ion angles for ion beams having energies below 5 keV because it is of practical importance in building advanced semiconductor apparatus and it is the energy range that is typically the most difficult for a commercial ion implanter to control in terms of ion beam angle, for example.

If the ion channeling techniques do not work because of the energy levels involved, manufacturers are forced to build some type of structure that is no longer a bare wafer. That structure has basically been a transistor, such as an NMOS transistor and one or two levels of metal in order to measure beam angle. That involves at least 5 or 6 masks and at least dozen processing steps. Once the structure has been built and implanted it is tested electrically using probes, for example.

Accordingly, suitable apparatus and methods for accurately measuring beam angles in an ion implanter at low energies, at lower cost, etc. are desirable, wherein the apparatus utilize fewer masks and operations to fabricate.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor apparatus fabrication by measuring ion beam angles utilizing high aspect ratio pillars of silicon on an insulating layer, for example. Two or more pillars are employed within an ion implantation system (e.g., using a single mask process and/or a two mask based system). The pillars(s) are operative to provide resistivity measurements before and after ion implantation (e.g., calibration), during ion implantation (e.g., in situ), and/or after ion implantation (e.g., verification). Based on the resistivity measurements, generation of an ion beam can be adjusted to improve uniformity of the beam angle as indicated. As a result, ion implantation can be performed with an improved angular uniformity and under tighter process controls.

According to one aspect of the invention, an ion beam angular measurement apparatus for providing feedback for a predetermined set ion beam angle comprising an arrangement of composite pillars formed on an insulating material, wherein the composite pillars selectively allow ion beams to penetrate a first layer of a pillar, wherein resistivity measurements are taken for each of the composite pillars before and after test ion beam implantation, and wherein the resistivity measurements yield information relating to an angle of the ion beam during test.

In another implementation of the invention, a method of fabricating a test ion beam angular measurement apparatus comprising forming composite pillars on a insulating layer, directing angular test ion beams at a pre-determined set ion beam angle toward the ion angular measurement apparatus located in an ion implantation system, measuring resistivity of the composite pillars before and after test ion beam implantation, as an indication of actual ion beam angle.

Yet another aspect of the invention provides a method for fabricating an ion beam angular measurement mask apparatus for providing feedback for a predetermined set ion beam angle comprising an arrangement of slots formed on an insulating mask, wherein the slots selectively allow ion beams to penetrate a workpiece, wherein resistivity measurements are taken on the workpiece before and after test ion beam implantation, and wherein the resistivity measurements yield information relating to an angle of the ion beam during test.

According to another aspect of the invention, a method of fabricating a test ion beam angular measurement apparatus comprising forming a structure associated with a workpiece, creating a first contact, a second contact and a third contact, measuring the resistivity between the first contact and the second contact, measuring the resistivity between the second contact and the third contact, measuring the resistivity between the first contact and the third contact; and developing calibration curves for an ion implanter under test based upon the various measurements.

Yet another aspect of the invention provides a method of fabricating an ion beam angular measurement apparatus comprising forming composite pillars on a silicon layer workpiece, wherein the composite pillars comprise a silicon oxide with a layer of photoresist is formed on an n-type oxide layer, directing ion beams towards the ion beam angular measurement apparatus located within an ion implantation system, and measuring resistivity of the silicon layer workpiece as an indication of actual ion beam angle.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIGS. 1-8 are cross sectional views illustrating an ion implantation angular measurement apparatus that utilizes a single mask process in accordance with an aspect of the present invention;

FIGS. 10-20 are cross sectional views illustrating an ion implantation angular measurement apparatus that utilizes a two mask process in accordance with at least one aspect of the present invention;

DETAILED DESCRIPTION OF THE INVENTION

Figure 5:
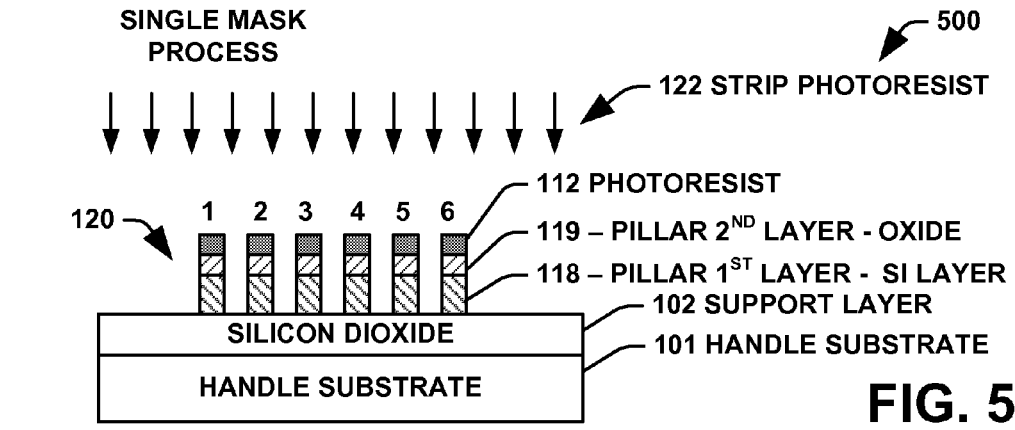

The present invention will now be described with reference to the attached drawings, wherein like reference numerals are used to refer to like elements throughout. It will be appreciated by those skilled in the art that the invention is not limited to the exemplary implementations and aspects illustrated and described hereinafter. For the sake of providing a clear description of the invention, the structures and the methods will be described in connection with periodic pillar structures. However, it is to be expressly understood that this description is not intended to be self-limiting in any manner. It is contemplated that the concepts of the present invention may be utilized with other types and configurations of periodic structures (e.g., trenches and the like) without departing from the spirit and the scope of the invention The present invention facilitates semiconductor apparatus fabrication by measuring ion beam angles utilizing high aspect ratio pillars of silicon on an insulating layer, for example. Two or more pillars are employed within an ion implantation apparatus (e.g., using a single mask process and/or a two mask based system). The pillars(s) are operative to provide resistivity measurements before and after ion implantation (e.g., calibration), during ion implantation (e.g., in situ), and/or after ion implantation (e.g., verification). Based on the comparison of pillar resistivity measurements (i.e., before and after an ion implantation), generation of an ion beam can be adjusted to improve uniformity of the beam angle as indicated. As a result, ion implantation can be performed with an improved angular uniformity and under tighter process controls.

The apparatus depicted in FIGS. 1-9 are provided for illustrative purposes and are not intended to include all aspects, components, and features of an apparatus. Instead, the apparatus in FIGS. 1-9 are depicted so as to facilitate a further understanding of the present invention using a single mask process. The apparatus in FIGS. 1-9 can also be built up on a "ready made" silicon-on-insulator workpiece, polysilicon on thermal oxide, and the like, for example.

Beginning with FIG. 1, a cross sectional view of a simplified exemplary portion of an ion implantation angular measurement apparatus 100 in accordance with an aspect of the present invention is illustrated. The angular measurement apparatus 100 can include a handle substrate 101 and an insulating support layer 102 (e.g., silicon dioxide, a fraction of a micron thick, e.g., 0.1-0.2 microns thick) formed upon the handle substrate 101 (e.g., approximately 770 microns thick), as illustrated, for example.

An exemplary partial ion implantation angular measurement apparatus 200 illustrated in FIG. 2 shows a single crystal silicon layer 104 formed, on an insulating layer 102, for example. Together a handle substrate 101, the insulating layer 102 and the silicon layer 104 can be referred to as a workpiece 108. An ion implantation 106 is illustrated in FIG. 2, utilizing an ion beam, having a number of characteristics including, dopant type, dose, beam current, angle of incidence, energy, and the like. Although the ion implantation 106 is depicted as being substantially orthogonal to a surface of the silicon layer 104, the implantation 106 can be at other incident angles with respect to the surface of the silicon layer 104. Ion implantation is well known by those of skill in the art.

A platen or electrostatic chuck (not shown) holds a handle substrate 101 and the platen is operable to move a workpiece 108 through an ion beam at a controlled rate, for example, so as to achieve desired implantation results. Generally, a given ion implantation 106 is performed in multiple passes of the workpiece 108 through the ion beam. By so doing, the substantially uniform implantation 106 across the workpiece 108 can be obtained because all parts or portions of the workpiece 108 move through the ion beam at about the same rate. An anneal 107 can be performed after the implantation 106 to repair any damage caused by the implantation 106, for example. Annealing processes are well known by those of skill in the art. In FIG. 3, an oxide layer 110 can be formed on top of a single crystal silicon layer 104 employing thermal oxidation or deposition, for example. The formation of the oxide layer 110 is well known by those of skill in the art.

Turning now to FIG. 4 in yet another embodiment of the present invention, a photoresist 112 can be deposited on an oxide layer 110 using a single mask process, for example, on a partial ion implantation angle measurement apparatus 400. The photoresist 112 can then be exposed 114 and etched 116, as illustrated, for example. The process of photolithography in semiconductor apparatus manufacturing is well known by those of skill in the art. FIG. 5 illustrates yet another embodiment of a partial ion implantation angle measurement apparatus 500 where a pillar first layer 118 of pillars 120 (e.g., pillars numbered 1-6) can be made out of a single crystal silicon layer 104 (FIG. 4), for example. A pillar second layer 119 can be formed out of the oxide layer 110 in FIG. 5 wherein a remaining photoresist 112 can be cleaned off or stripped 122 or left on using any photolithographic process that is well known to those of skill in the art. It is to be appreciated that any number of pillars, two or greater can be utilized in forming an angular measurement apparatus, of various widths, spacings, heights, materials, angular orientation on the workpiece, etc., and all are contemplated within this invention.

Figure 6:
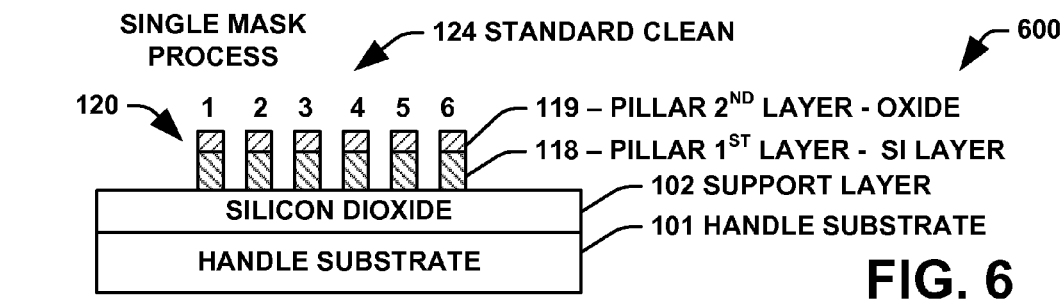

After the photoresist 112 is stripped 122 in FIG. 5 an optional standard clean 124 can be performed in FIG. 6. An implant test 126 can be performed at an angle θ 127 as illustrated in the cross sectional view of FIG. 7, for a given apparatus 700 that is being tested for a given ion implantation system and the apparatus 700 as illustrated is also shown in a top view in FIG. 9, for example. In the present example, six of the pillars 120 are shown (e.g., numbers 1-6) with an angular ion beam 126, as illustrated. In this example the angular beam is shown directed at a clockwise angle θ 127 (e.g., from vertical). Under these conditions, pillar 6 (e.g., the right most pillar) will be the pillar with the greatest number of ions or dopant implanted 126 in a pillar first layer 118 (e.g., silicon), for example, whereas pillars 1-5 will be shielded from a portion of the ion implantation 126 by the pillar to their immediate right. In other words, pillar 5 is partially shielded by pillar 6; pillar 4 is partially shielded by pillar 5; and so on. Ions implanted into the second pillar layer 119 or the silicon dioxide insulating layer 102 does not change the resistivity of the pillars. Because the spacing is the same between the pillars in this example, after implantation 126 the resistivity of pillars 2 and 5 remains approximately equal, and the resistivity between 3 and 4 remains about equal, whereas the resistivity of pillars 1 and 6 is no longer equal and represents a function of the ion implantation angle θ 127. It should be noted however that because of scattering effects that are well known by those of skill in the art, there may be different readings at the center of the pillars, as opposed to pillars at the edges. This is true even after accounting for differences in the line lengths of the pillars. If the ion implantation was coming down from the top of the ion implanter in a vertical fashion there would be no difference in resistivity between the pairs of the pillars, for example. It should be appreciated that the number of pillars can be two or greater, the spacing between pillars can be non-equal and the lengths of pillars can be non-symmetrical, the pillar materials can vary from one pillar to another, and the like, and all such variations are contemplated herein. In addition, these pillars can be part of a test apparatus or part of an apparatus wafer, for example. In FIG. 8, for example, an anneal 128 can be performed to repair any damage caused by the implantation 128 (FIG. 7).

Figure 7:
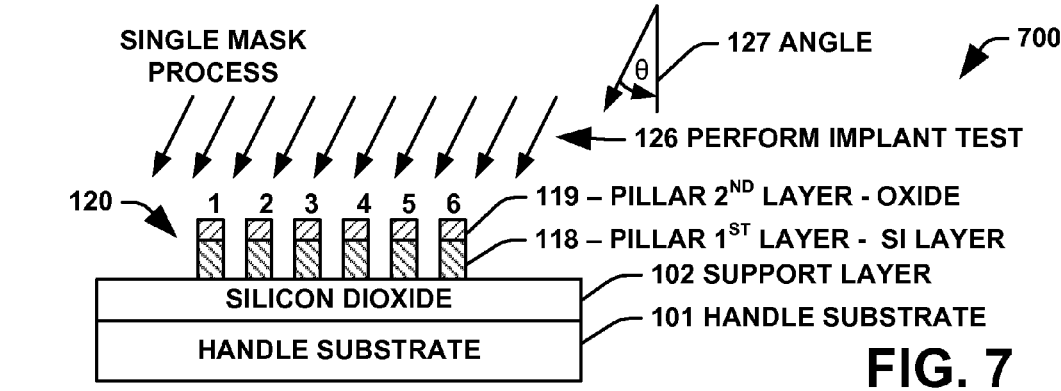
Figure 8:
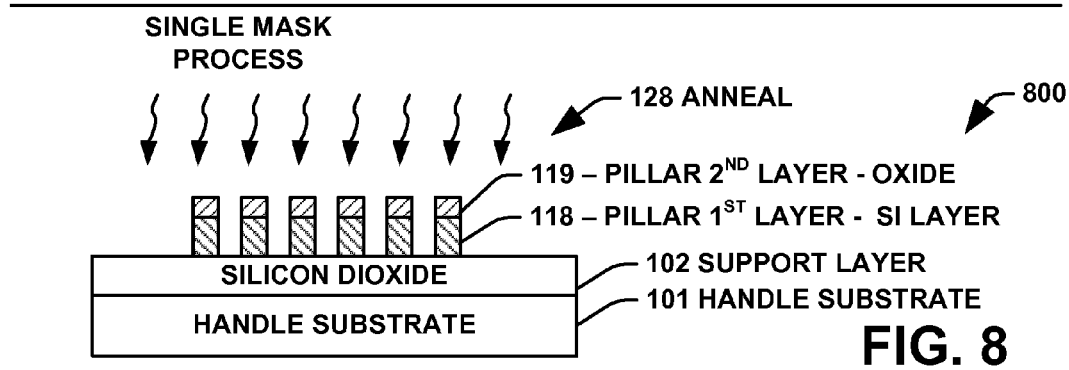
Figure 9:
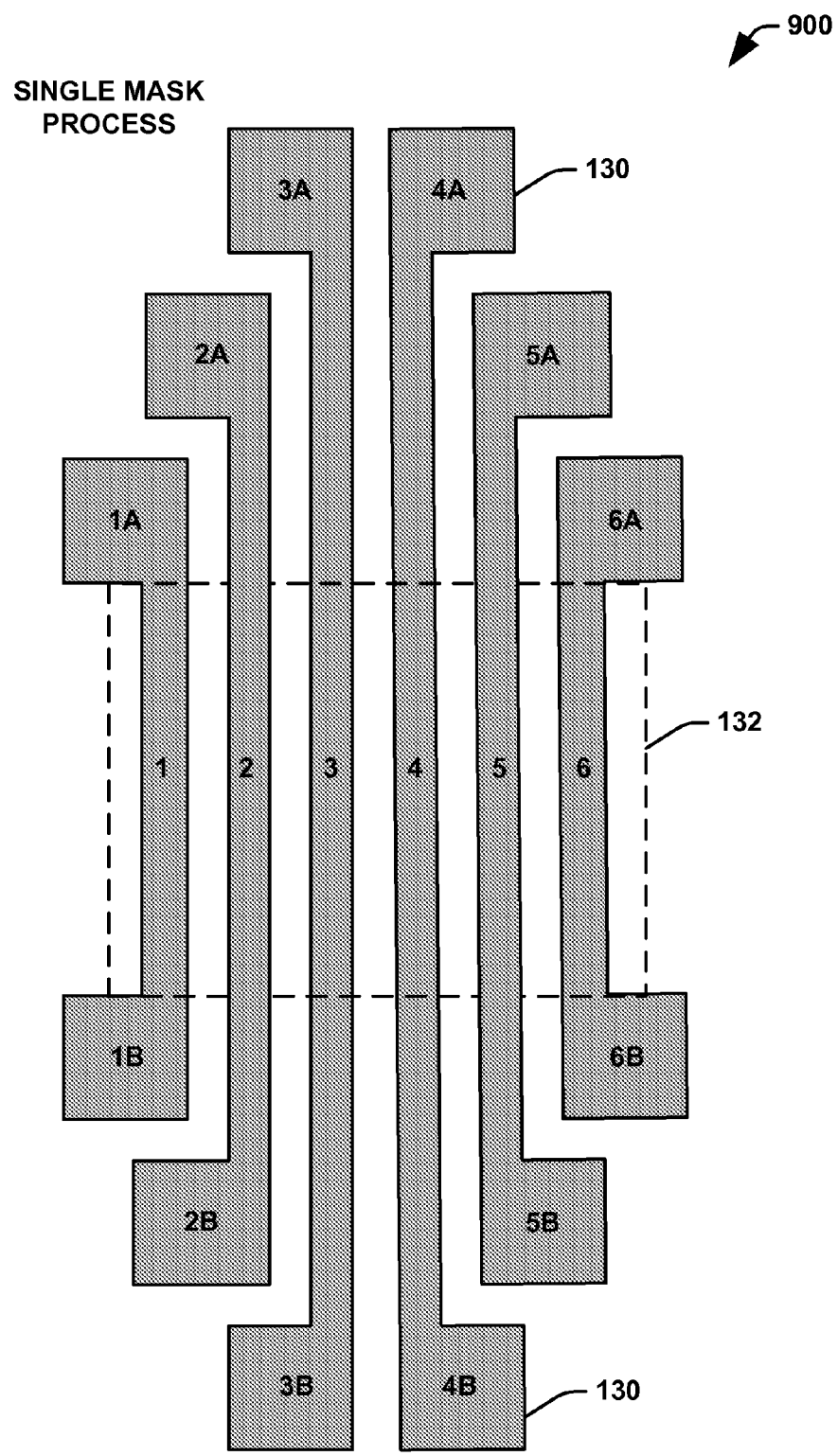
FIG. 9 is a top view illustrating an angular measurement apparatus utilizing a single mask in accordance with an aspect of the present invention.

Referring to FIG. 9 is a top view of the angular measurement apparatus 900 shown for example in FIGS. 6, 7 and 8. Contact pads 130 (e.g., 100 microns×100 microns) are illustrated and numbered 1A-6A and 1B-6B, for example. Prior to the ion implantation 126 (FIG. 7) the initial resistivity of pillar 1 and pillar 6 are approximately equal, the resistivity of pillar 2 and pillar 5 are approximately equal, and the resistivity of pillar 3 and pillar 4 are approximately equal. Pillars 3 and 4 have the largest resistivity initially because they have the longest lengths, whereas the resistivities of pillars 1 and 6 have the least resistivity initially due to having the shortest length.

Once the test implantation 126 (FIG. 7) and the optional anneal 128 (FIG. 8) are performed the resistivity of the various pillars can be measured and compared as a function of the angle of implantation. The resistivity measurements can be carried out using probe instruments and electrical test equipment that are well known by those of skill in the art. The resistivity measurements can be made one pillar at a time connecting to a single set of contacts, or with twelve pins that make contact with all of the contact pins at the same time in order to make six resistivity measurements simultaneously, manually or automatically, etc. Initially, prior to implantation, the resistivity of each pillar is given by equation:

$$R = rho \times L/(A) \tag{Eq. 1}$$

wherein rho is the variable resistivity of the doped pillars (e.g., 0.03 ohm-cm), L is the length (e.g., 50 micro-meters) and A is the cross section area (150 nanometers×100 nanometers). Therefore, for example, the resistivity of pillar 1 and pillar 6 are initially equal and $R_1$ and $R_6$ are equal to 1 million ohms, for example, the resistivity of pillar 2 and pillar 5 are initially equal and $R_2$ and $R_5$ are about 5 million ohms, and pillar 3 and pillar 4 are initially equal and $R_3$ and $R_4$ are approximately 9 million ohms.

Approximately identical single mask angular measurement apparatus (e.g., apparatus (1), apparatus (2), apparatus (3), etc., like the apparatus illustrated in FIG. 7 would be placed successively into an ion implanter at "known" angles (e.g., −2, −1, 0, 1, 2 degrees) and the resistivity of the pillars in those apparatus would be measured to develop calibration curves for the ion implanter being tested, for example. It is also possible to measure the angles as a function of pillar resistivity using mathematical modeling as contemplated in this invention.

Referring now to FIGS. 10-21, they represent at least one embodiment of the present invention illustrated as a two mask implantation angular measurement apparatus. The advantage of the angular measurement apparatus formed with two masks with added complexity to the previous method is that it allows the top and bottom probe pads and leads to be doped more heavily than the pillars within the middle section of the apparatus which remains lightly doped. This may be necessary for testing low and mid-dose implantations, where the pads must be heavily doped to make a low contact resistance, but the pillars can be lightly doped to adequately detect the implantation angle under test. This will be discussed in detail the following discussion.

FIG. 10 illustrates a cross sectional view of a simplified exemplary portion of an ion implantation angular measurement apparatus 100 in accordance with an aspect of the present invention. The angular measurement apparatus 1000 can include a handle substrate (not shown for simplification) and an insulating layer 1002 (e.g., silicon dioxide) formed upon the handle substrate, for example. The apparatus depicted in FIGS. 10-21 are provided for illustrative purposes and are not intended to include all aspects, components, and features of the apparatus. Instead, the apparatus in FIGS. 10-21 is depicted so as to facilitate a further understanding of the present invention using a dual or two mask process. The apparatus in FIG. 10-21 can also be built up on a "ready made" silicon-on-insulator workpiece, for example.

An exemplary partial ion implantation angular measurement apparatus 1100 illustrated in FIG. 11 shows a silicon layer 1004 formed, on an insulating layer 1002. It is to be appreciated that the silicon layer 1004 formed on the insulating 1002 can be replaced by a polysilicon layer deposited on the insulating layer 1002, for example. Together a handle substrate, the insulating layer 1002 and the silicon layer 1004 can be referred to as a workpiece 1008. An ion implantation 1006 is illustrated in FIG. 11, utilizing an ion beam, for example, a ribbon beam, having a number of characteristics including, dopant type, dose, beam current, angle of incidence, energy, and the like. Although the ion implantation 1006 is depicted as being substantially orthogonal to a surface of the silicon layer 1004, the implantation 1006 can be at other incident angles with the surface of the silicon layer 1004. Ion implantation is well known by those of skill in the art.

A platen or electrostatic chuck (not shown) holds the handle substrate and the platen is operable to move the workpiece 1008 through the ion beam 1006 at a controlled rate, for example, so as to achieve desired implantation results. Generally, a given ion implantation 1006 is performed in multiple passes of the workpiece 1008 through the ion beam. By so doing, a substantially uniform implantation 1006 across the workpiece 1008 can be obtained because all parts or portions of the workpiece 1008 move through the ion beam at about the same rate. In contrast, other ion implantation systems employ a process disk that may also incorporate the present invention. An anneal 1007 can be performed after the implantation 1006 to repair damage caused by the implantation 1006, for example. In FIG. 12, an oxide layer 1010 can be formed on top of the single crystal silicon layer 1004 employing thermal oxidation or deposition, for example. The formation of oxide layers utilizing various techniques is well known by those of skill in the art.

Figure 14:
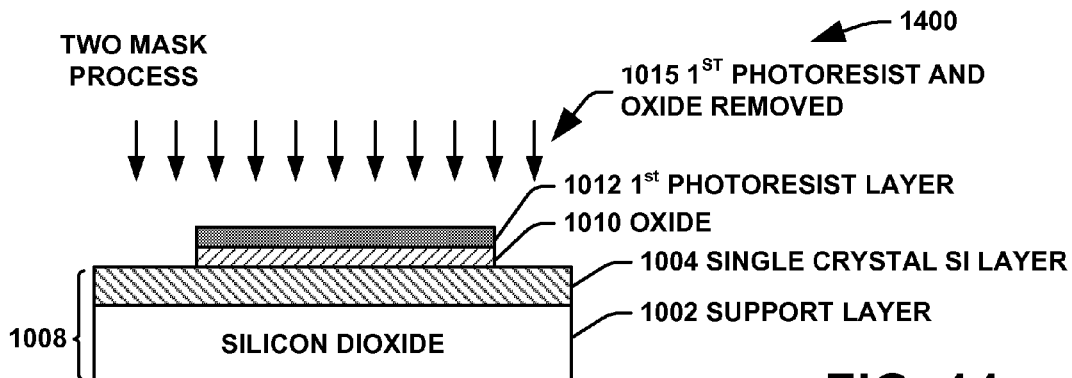
Figure 15:
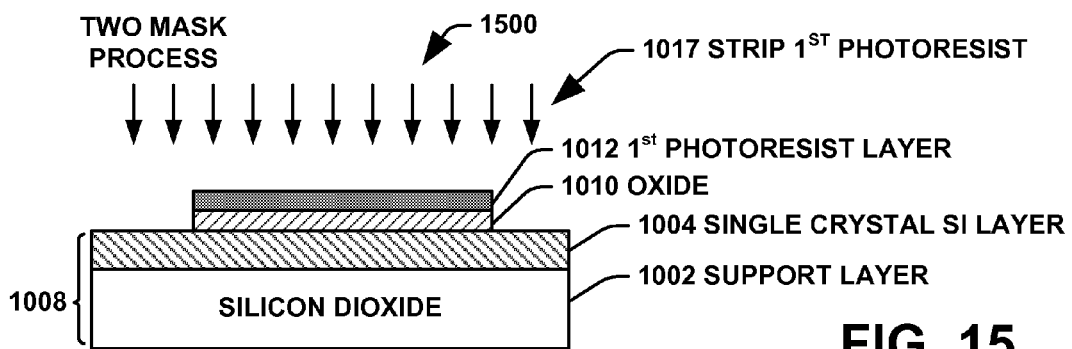
Figure 16:
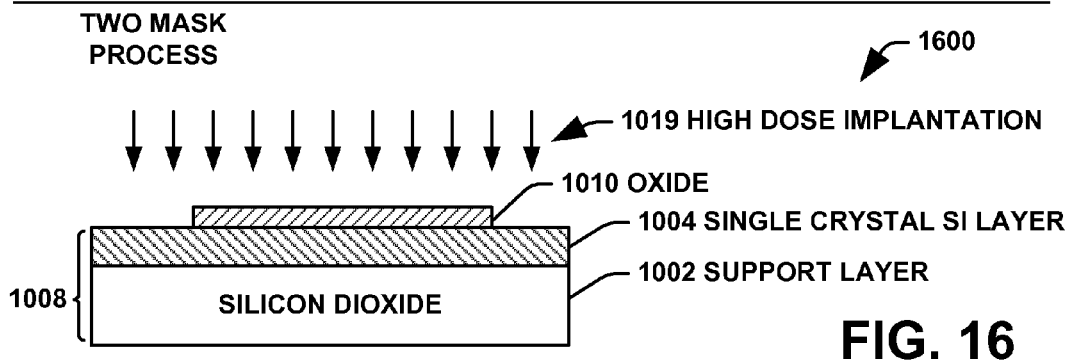
Figure 17:
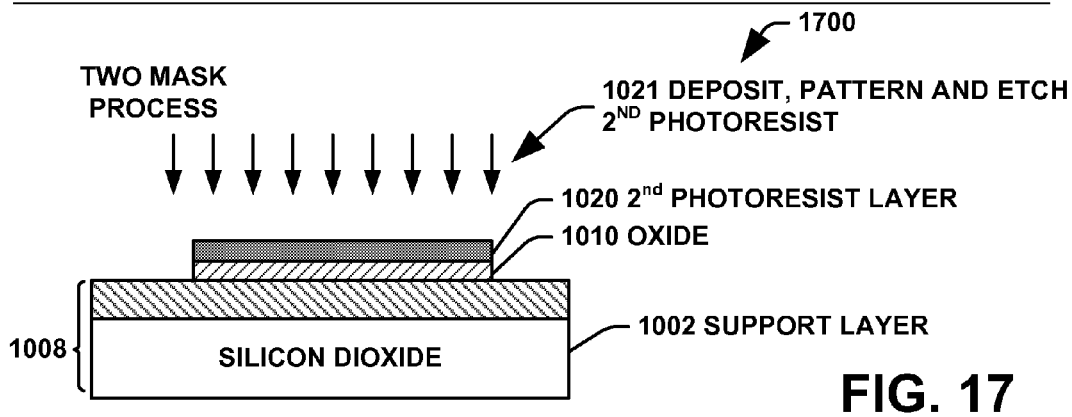
Figure 18:
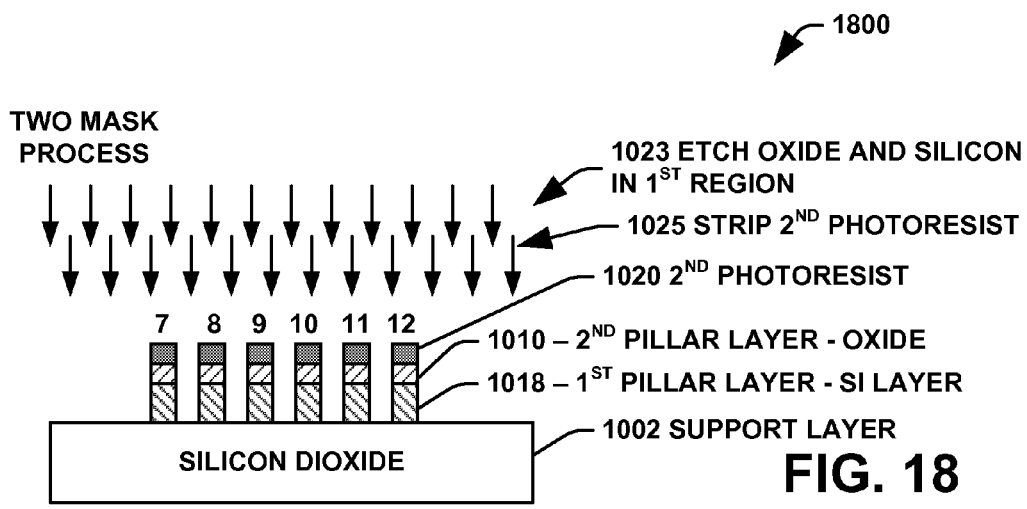
Figure 19:
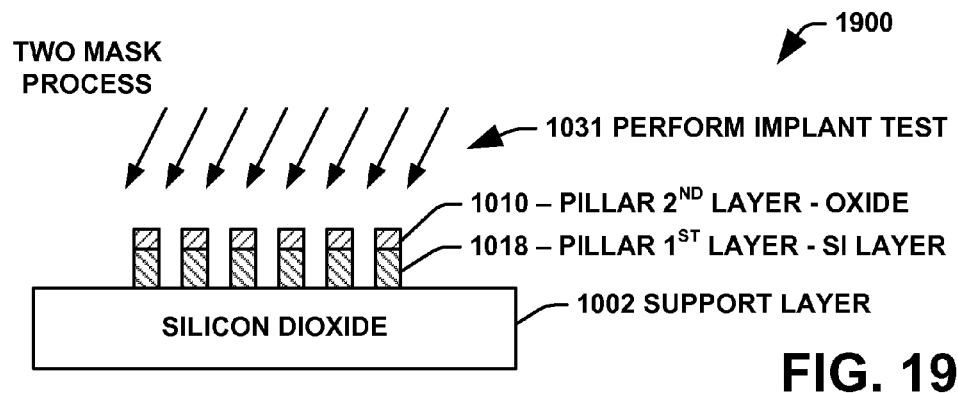
Figure 20:
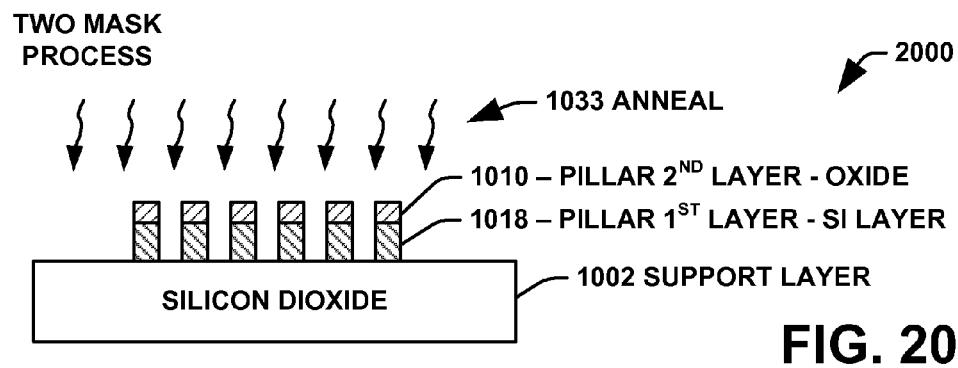

Turning now to FIG. 13 in yet another embodiment of the present invention, a first photoresist 1012 can be deposited on an oxide layer 1010 using a masking process, for example, on a partial ion implantation angle measurement apparatus 1300. The first photoresist layer 1012 can then be exposed 1014 and patterned/etched 1016. The process of photolithography in semiconductor apparatus manufacturing is well known by those of skill in the art. FIG. 14 illustrates a partial measurement apparatus 1400 with a portion of the first photoresist layer 1012 and a portion of the oxide layer 1010 removed 1015. The embodiment in FIG. 15 illustrates a partial ion implantation angle measurement apparatus 1500 wherein the remaining first photoresist layer is stripped 1017. A high dose implantation 1019 can be performed in FIG. 16, for example. The high dose implant 1019 is performed within regions 1020 of FIG. 21 (i.e., a first region) and 1023 of FIG. 21 (i.e., a second region). Contact pads 1021 (e.g., pads numbered 1C-6C and 1D-6D) and leads within region 1020 and 1023 must be heavily doped to make low resistance contacts pads 1021. Area 1018, i.e., $3^{rd}$ region (FIG. 21) is covered with a mask during the ion implantation 1019 (FIG. 16) to prevent doping during the high dose implant 1019. In FIG. 17 as illustrated, a second photoresist 1020 can be deposited, patterned and etched 1021 on an oxide layer 1010. As illustrated in FIG. 18 pillars 7-12 are now formed on the on the insulating layer 1002 comprising, a first pillar layer 1018 made of silicon and a second pillar layer 1010 made of oxide, for example. A second photoresist layer 1020 can be removed or stripped 1025 after the etching of the oxide and silicon 1023 down to the insulating layer 1002. As illustrated in FIG. 19 an implant test 1031 can be performed similar to the implant test that was discussed supra. An anneal 1033 can be performed as illustrated in FIG. 20 to repair any damage caused by the ion implantation test 1031 (FIG. 19).

Approximately identical two mask angular measurement apparatus (e.g., apparatus (1), apparatus (2), apparatus (3), etc., like the apparatus illustrated in FIG. 7 would be placed successively into an ion implanter at "known" angles (e.g., −2, −1, 0, 1, 2 degrees) and the resistivity of the pillars in those apparatus would be measured to develop calibration curves for the ion implanter being tested, for example. It is also possible to measure the angles as a function of pillar resistivity using mathematical modeling as contemplated in this invention.

Figure 22:
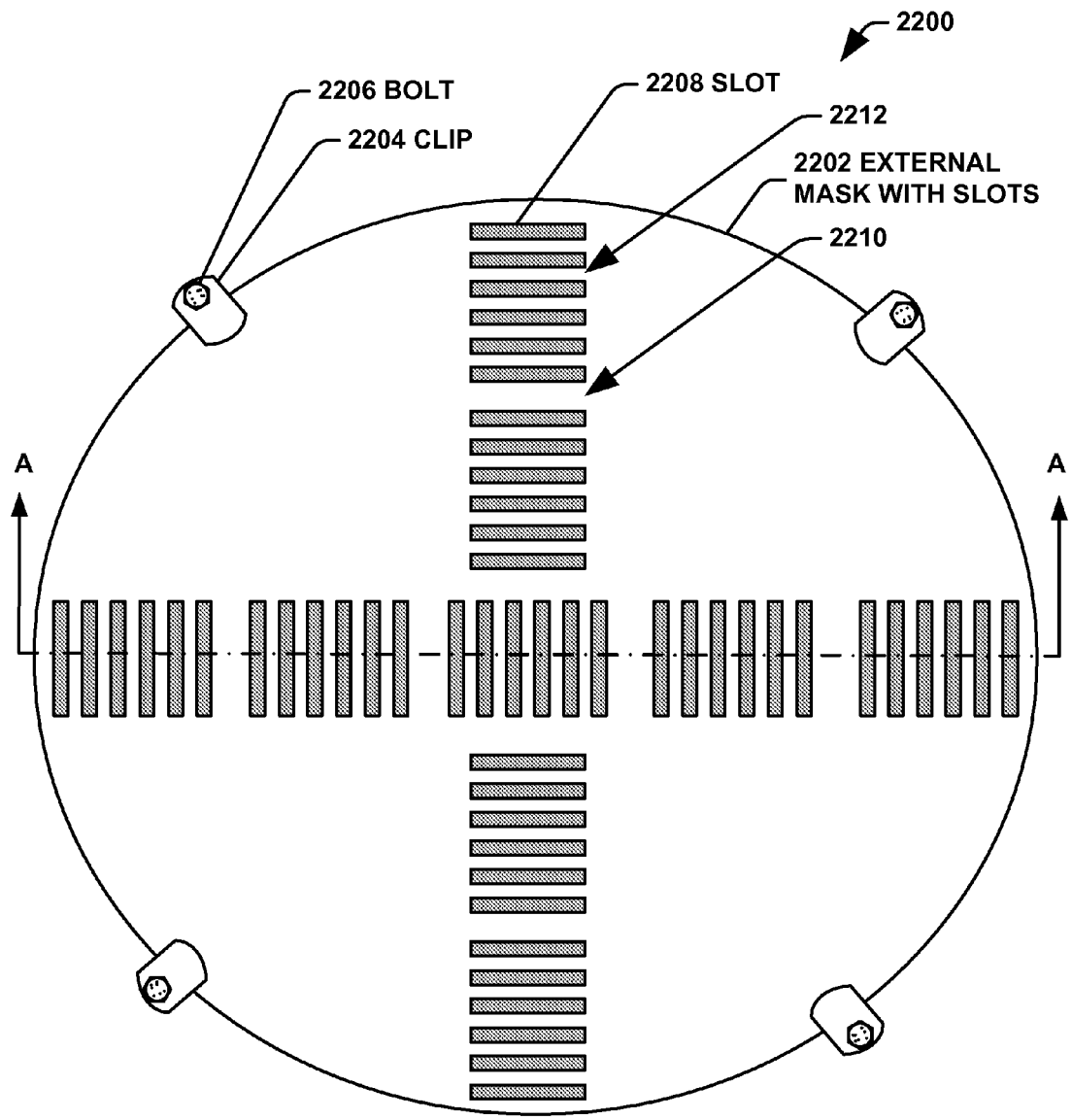
FIG. 22 is a top view illustrating an ion implantation angular measurement system that utilizes a slotted mask in accordance with an aspect of the present invention.
Figure 23:
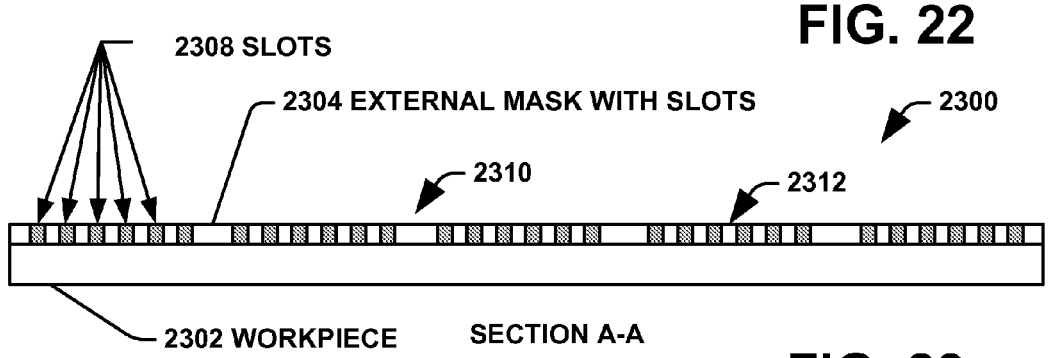
FIG. 23 is a side view of a slotted mask ion implantation angular measurement apparatus in accordance with an aspect of the present invention.

FIGS. 22-23 illustrate yet another embodiment of the present invention according to at least one aspect of the present invention. FIG. 22 illustrates a top down view of an ion implantation angle measurement apparatus 2200. A high aspect ratio external mask 2202 can be held or clamped to a workpiece 2302 (FIG. 23) that is non-fixedly attached to a platen using an electrostatic chuck, a clip 2204 and bolt 2206 arrangement as shown, or any suitable arrangement for holding down the workpiece 2302 (FIG. 23). Slots 2308 can be cut into the mask using photolithography, laser techniques, or any other suitable methods for forming slots 2308 in the mask 2304. The mask 2304 can be made of graphite, polysilicon, or any other suitable material compatible with semiconductor implantation. A blanket n-well may be formed within the mask 2202, for example by performing an implantation and a damage anneal prior to the angle test implantation. The blanket n-well implantation is performed in order to create an n-type region at the surface of a p-type wafer, into which p/n junctions can be formed by test implants of p-type dopants.

The high aspect ratio slots 2308 can have an aspect ratio in both the vertical and horizontal direction of approximately 20 to 1, for example. The slots 2308 can be approximately 20 microns wide and about 400 microns long with the mask 2304 having a thickness of approximately 500 microns, for example. The large spacing 2310 between slots 2308 can be greater than 500 microns wide, whereas the small spacing 2312 between slots 2308 can be approximately 500 microns. However, it should be appreciated that the slot 2208 dimensions can be any suitable length, width and depth or irregular in shape and the slots 2308 can be laid out in any suitable pattern, number of slots, and the like. In this embodiment the resistivity of the workpiece 2302 in the masked area (along the length of the regions implanted by ions passing through the slits), the resistance in the completely closed areas and the resistance in the open areas are compared against each other and calibrated measurements to determine the beam angle. The measurements can be taken using a four point probe, for example, and electrical equipment or any suitable electrical measurement means. The advantage of this apparatus 2200 is that it can be used over and over in comparing various implanters and creating various calibration curves. The mask 2202 can be precision engineered and located on the workpiece 2302 within a given accuracy and these techniques are well known by those of skill in the art.

Figure 24:
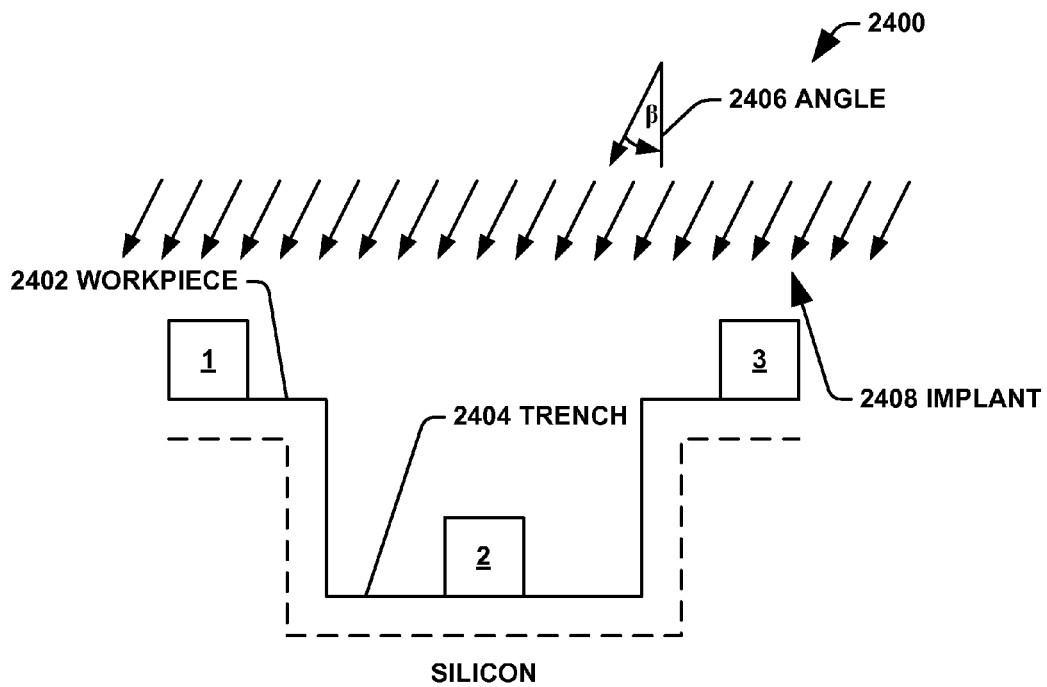
FIGS. 24 and 25 are side views of yet another ion implantation angular measurement apparatus in accordance with yet another aspect of the present invention.

Illustrated in FIG. 24 is another embodiment of the present invention, utilizing contacts 1-3, as illustrated, and a trench 2404 fabricated in a workpiece 2402 to create an ion implantation angular measurement apparatus 2400. The resistivity between contacts 1 and 2, between contacts 2 and 3, and between contacts 1 and 3 can be measured for the apparatus 2400 formed on a silicon workpiece 2402. In measuring the resistivity between 1 and 2, for example, because contact 1 is outside the trench and contact 2 is located in a trench, as illustrated, the current has to flow horizontally, then vertically and then horizontally again. If the ion implantation is in a vertical direction (zero degrees) then the doping of the vertical walls will be a minimum value or approximately zero, for example, and will be a high resisitivity region. Therefore, the resistivity between contacts 1 and 2 and between 2 and 3 will be high, for example. If the angle is greater than zero degrees and the angle β 2406 is as illustrated, the vertical wall between contacts 1 and 2 will be implanted by the dopant and the resistivity between contacts 1 and 2 will be lower than the resistivity between contacts 2 and 3. By taking various measurements at various angles β 2406 for an ion implanter under test, calibration curves can be developed for the ion implantation equipment under test.

Figure 25:
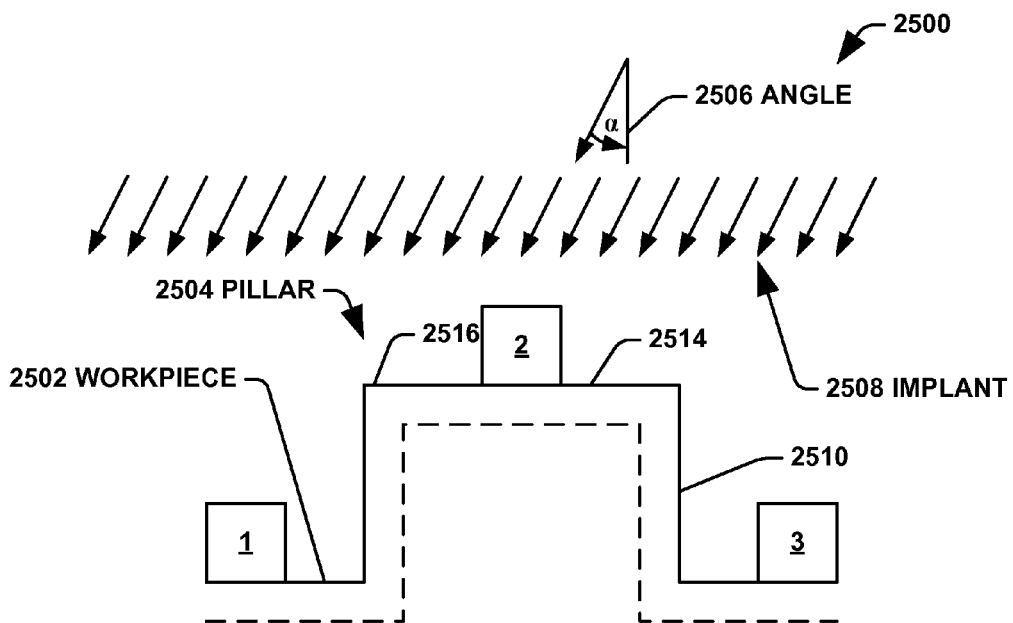

FIG. 25 illustrates a similar ion implantation angular measurement apparatus 2500 to FIG. 24, except contact 2 is located on top of a pillar 2504 in the workpiece 2502 in FIG. 25 rather then being located in a well as in FIG. 24; however, the principles of measuring the resistivity between the various contacts are similar. In this case an ion beam 2506 is directed downward and to the left as illustrated in FIG. 25 as angle α 2506. In this example, a right vertical side 2510 of the pillar 2504 is implanted 2508 with ions, whereas a left vertical side 2512 is shielded from implantation 2508 by the pillar 2504. It should be appreciated also that the contacts 1-3 are much smaller than those shown in FIG. 25. In addition, a right horizontal surface 2514 is fully implanted 2508 with ions as shown, whereas a left horizontal surface 2516 is partially blocked by the pillar 2504. Therefore in this situation the resistivity from contact 1 to contact 2 is greater than the resistivity from 2 to 3, for example. By utilizing various apparatus 2500 of this type, various calibration curves can be generated for each ion implantation system under test for angular accuracy.

Figure 26:
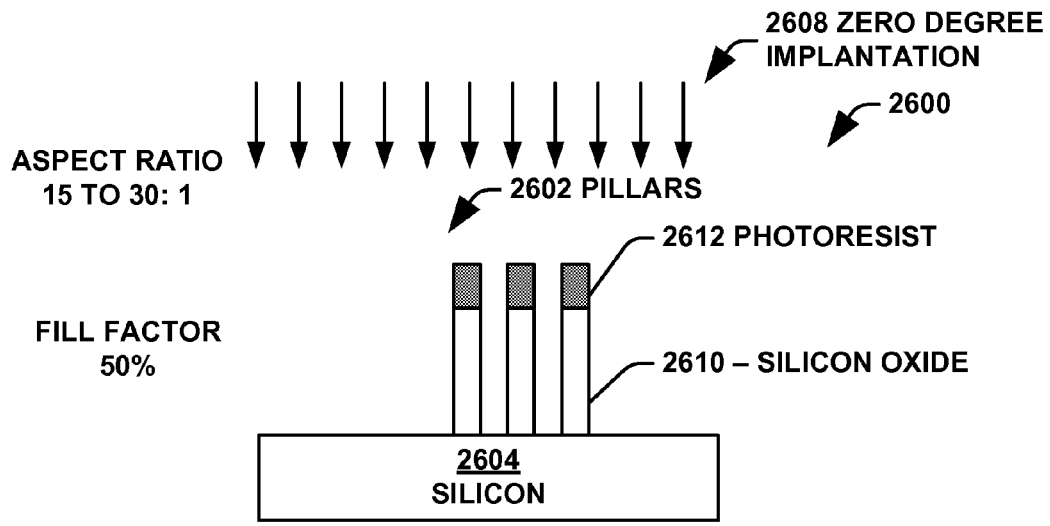
FIGS. 26 and 27 are side views of yet another ion implantation angular measurement apparatus in accordance with yet another aspect of the present invention.
Figure 27:
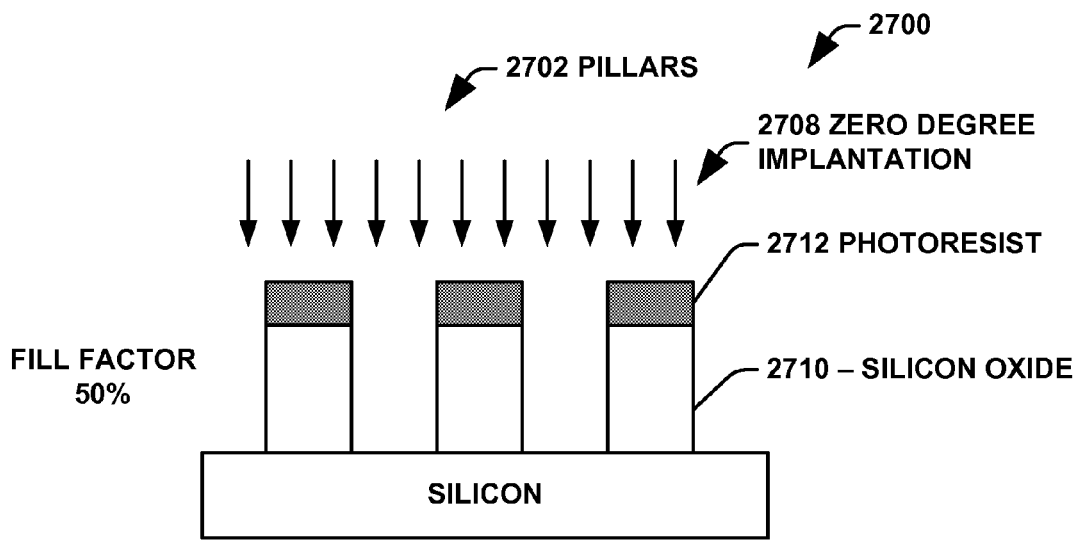

FIG. 26 illustrates pillars 2602 that utilize a fill factor in order to create an ion implantation angular measurement apparatus 2600, according to yet another aspect of the present invention. The pillars 2602 comprise a silicon oxide 2610 or any insulating material formed on a silicon layer 2604. A layer of photoresist 2612 is formed on the oxide layer 2610 utilizing photolithographic techniques that are well know by those of skill in the art. For example, if the pillar and the space between the pillars are equally wide that represents a fill factor of 50%. In this approach, the resistivity in the n-type silicon layer 2604 beneath the pillar is measured for resistivity and the resistivity of the pillars is not measured because the pillars are built out of insulating material. The resistivity of the workpiece silicon 2604 can then be measured using a four point probe. In FIG. 27 the fill factor is again 50% and theoretically for a vertical implant the same resistivity will be measured in FIG. 26 and FIG. 27. If however there is an angle error, the resistivity of FIG. 26 will increase more than FIG. 27 because the spacing 2606 in FIG. 26 is less than in FIG. 27 and therefore the pillars 1602 in FIG. 26 will block more of the implanted dose into the silicon base 2604. In a zero degree implant 2608 (a vertical implant) in FIG. 26 and 2708 in FIG. 27, the resistivity of the silicon bases, 2604 and 2704 respectively, is equal because the fill factor is equal and there is the same number of pillars (assuming the width of the pillars is the same). In this approach the resistivity is measured in the bottom silicon herein, rather than in the pillars themselves. Calibration curves, as discussed supra, are again generated based upon the resistivity measured using the apparatus 2600 and 2700. In one embodiment the apparatus bases 2604 and 2704 can be raw silicon as drawn or the bases 2604 and 2704 can be initially implanted with ions prior to the formation of the pillars 2602 and 2702. It should be noted that the test implant can be of the same or of the opposite conductivity as the initial implantation.

Figure 21:
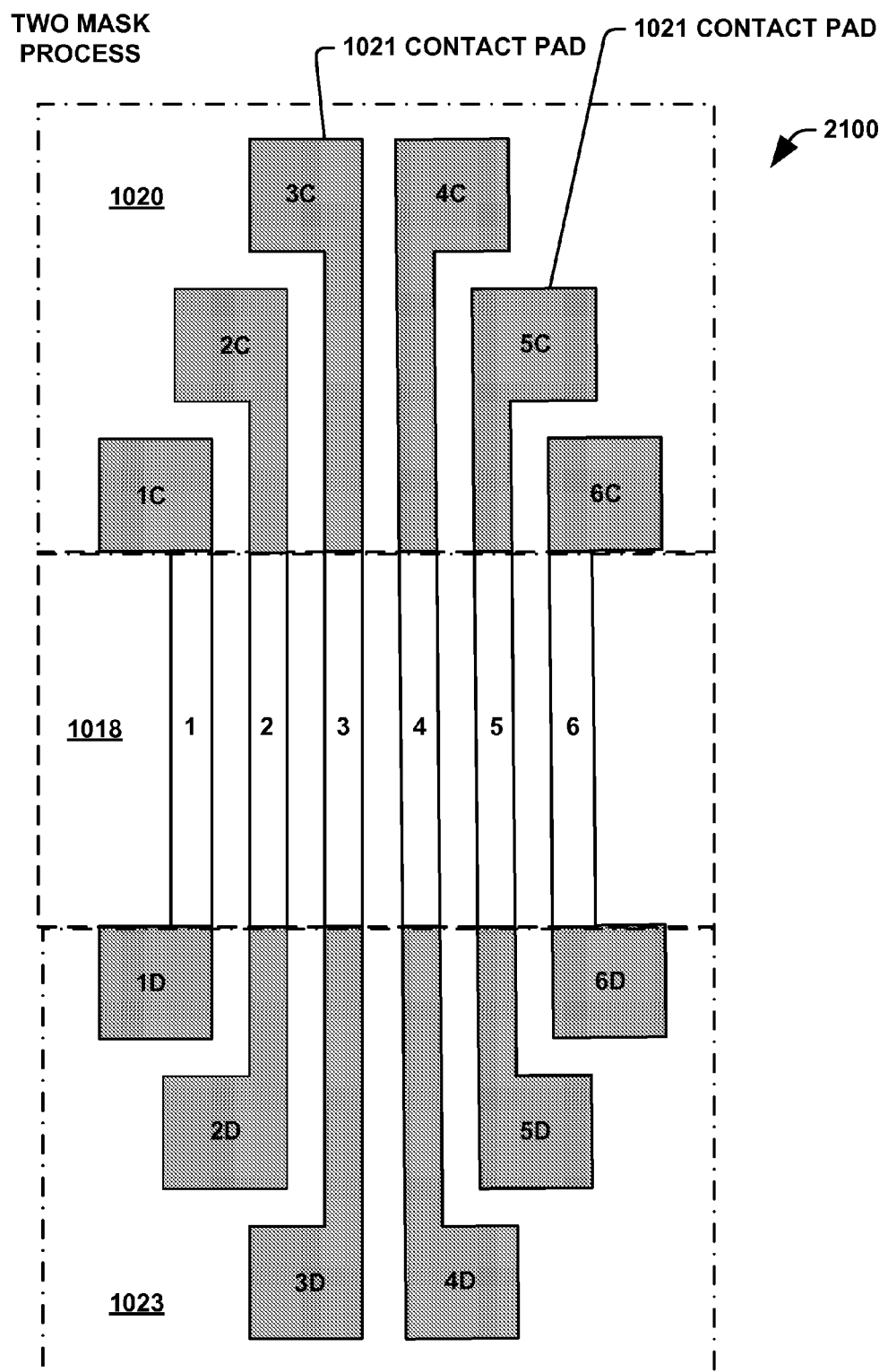
FIG. 21 is a top view illustrating a two mask ion implantation angular measurement system in accordance with an aspect of the present invention.
Figure 28:
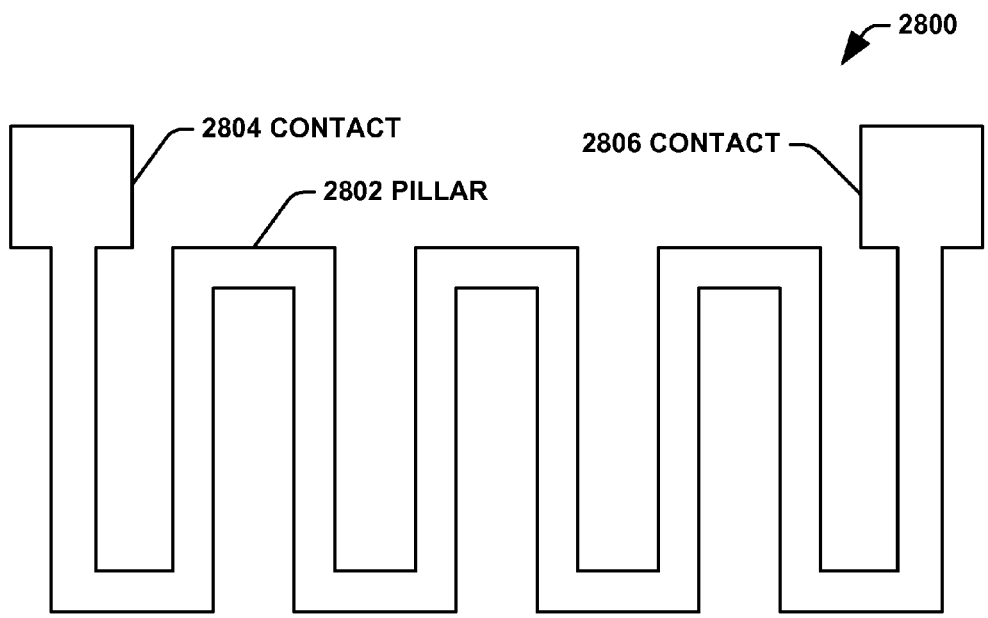
FIG. 28 is a top view of a serpentine ion implantation angular measurement apparatus in accordance with yet another aspect of the present invention.
Figure 29:
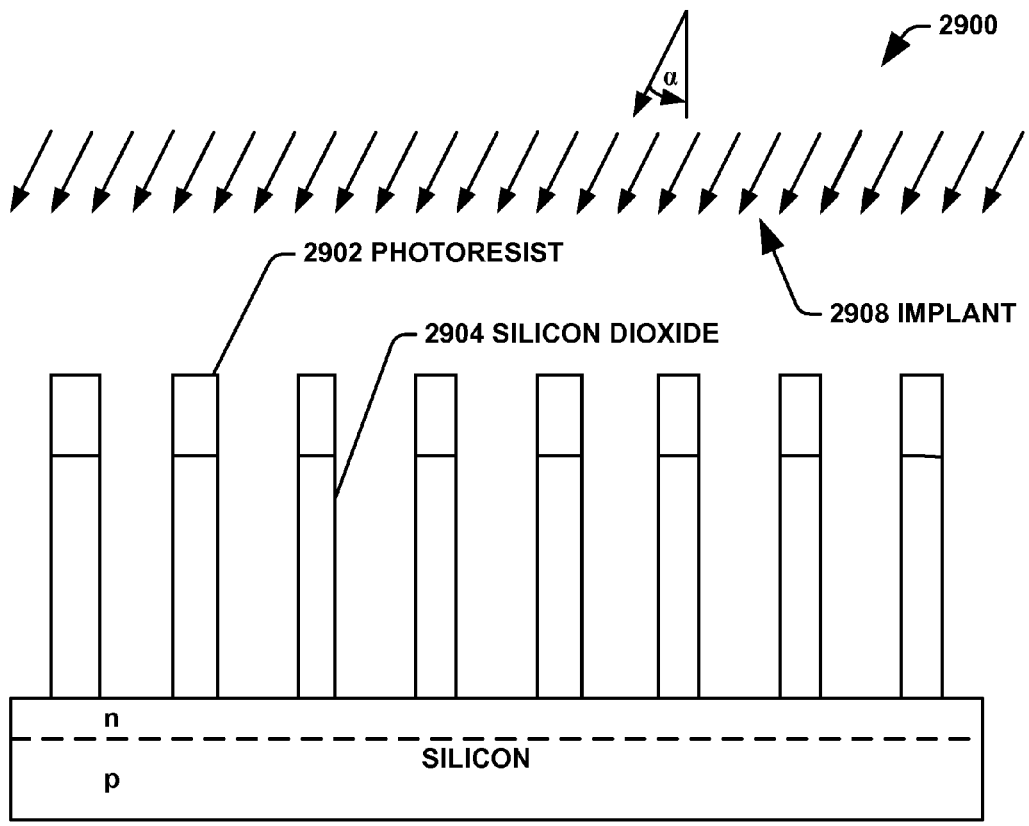
FIG. 29 is a side view of a serpentine ion implantation angular measurement apparatus in accordance with another aspect of the present invention.

FIGS. 28 and 29 illustrate a top and side view of a similar embodiment to FIG. 21 according to an aspect of the present invention. However, by providing a serpentine structure 2802 the angular measurement apparatus 2800 can measure smaller ion angle changes by measuring the current over a greater distance, for example. Recalling equation 1 discussed supra, R=rho×L/(A), if the length (L) of the apparatus is increased for the same area (A) and rho, (electrical resistance of a uniform specimen of the material, measured in ohms) therefore a higher resistivity is measured.

The resistivity of the serpentine apparatus 2802 can be measured utilizing well known probing equipment. When measuring a very small resistance, the contact resistance can govern and completely obscure changes in the resistance of the angular measurement apparatus 2800. By increasing the length of the apparatus 2800 the contact resistance measurement across contacts 2804 and 2806 can be minimized.

Figure 30:
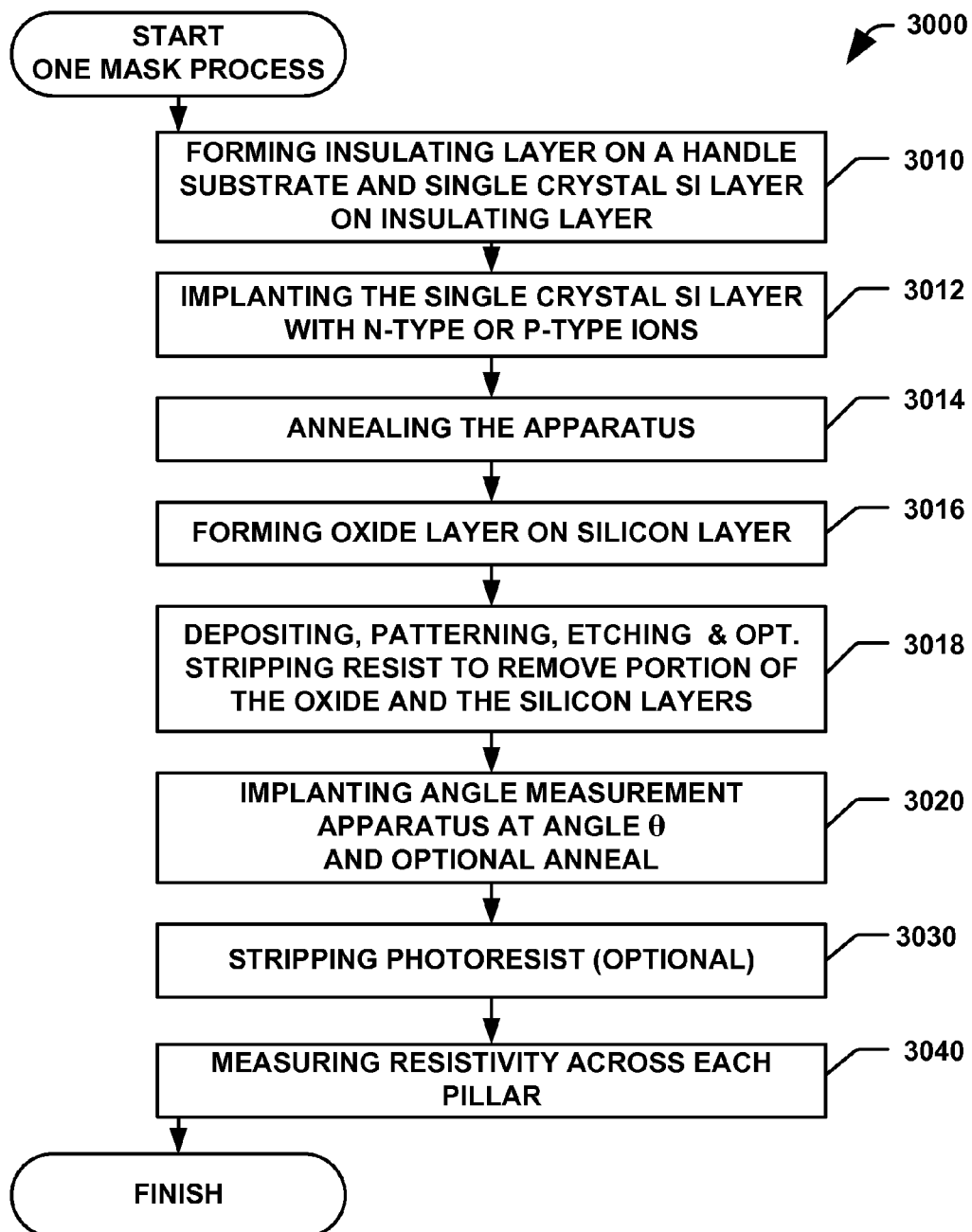
FIG. 30 is a flow diagram illustrating a method of fabricating an ion implantation angular measurement apparatus utilizing a single mask procedure in accordance with an aspect of the present invention.

FIG. 30 illustrates an exemplary method 3000 of a one mask process for fabrication of an angular measurement apparatus according to an embodiment of the invention. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the method may be implemented in association with the apparatus and systems illustrated and described herein as well as in association with other systems not illustrated herein.

The exemplary method 3000 (FIG. 30) is illustrated along with FIGS. 1-9. FIGS. 1-9 illustrate cross-sectional views and a top view of an exemplary angle measurement apparatus. The method 3000 begins at 3010 with forming an insulating layer 102 (e.g., silicon dioxide, a fraction of a micron thick, e.g., 0.1 –0.2 microns thick) over a handle substrate 101 (e.g., approximately 770 microns thick). In addition, at 3010 a single crystal silicon layer 104 is formed on the insulating layer 102. Together the handle substrate 101, the insulating layer 102 and the silicon layer 104 can be referred to as a workpiece 108, as illustrated in FIG. 3.

At 3012 of FIG. 30 an ion implantation 106 is illustrated in FIG. 2, utilizing an ion beam, having a number of characteristics including, dopant type, dose, beam current, angle of incidence, energy, and the like. The single crystal silicon layer 104 can be implanted with n-type or p-type ions. Although the ion implantation 106 is depicted as being substantially orthogonal to a surface of the silicon layer 104, the implantation 106 can be at other incident angles with the surface of the silicon layer 104. Ion implantation is well known by those of skill in the art. It should be appreciated that a platen or electrostatic chuck (not shown) holds the handle substrate 101 and the platen is operable to move the workpiece 108 through the ion beam at a controlled rate, for example, so as to achieve desired implantation results. Generally, the ion implantation 106 is performed in multiple passes on the workpiece 108 through the ion beam. By so doing, a substantially uniform implantation 106 across the workpiece 108 can be obtained because all parts or portions of the workpiece 108 move through the ion beam at about the same rate.

An anneal 107 (FIG. 2) can be performed at 3014 after the implantation 106 to repair any damage caused by the implantation 106, for example. Annealing processes are well known by those of skill in the art. In FIG. 30 at 3016, an oxide layer 110 can be formed on top of the single crystal silicon layer 104 employing thermal oxidation or deposition, for example. The formation of the oxide layer 110 is well known by those of skill in the art.

At 3018, of FIG. 30 photoresist 112 can be deposited on the oxide layer 110 using a single mask process, for example, on a partial ion implantation angle measurement apparatus 400 illustrated in FIG. 4. The photoresist 112 can then be exposed 114 and etched 116, as illustrated at 3018, for example. The photolithographic process is carried out to remove a portion of the oxide 110 and a portion of the silicon layer. The process of photolithography in semiconductor apparatus manufacturing is well known by those of skill in the art.

FIG. 5 illustrates a partial ion implantation angle measurement apparatus 500 where a pillar first layer 118 of the pillars 120 (e.g., pillars numbered 1-6) can be made out of the single crystal silicon layer 106 (FIG. 4), for example. A pillar second layer 119 can be formed out of the oxide layer 110 in FIG. 5 wherein a remaining photoresist 112 can be optionally cleaned off or stripped 122 using any photolithographic process that is well known to those of skill in the art or the photoresist can be removed in a subsequent act. It is to be appreciated that any number of pillars, two or greater can be utilized in forming an angular measurement apparatus, of various widths, spacings, heights, materials, angular orientation on the workpiece, number of layers, etc., and all are contemplated within this invention. After the photoresist 112 is stripped 122 in FIG. 5 an optional standard clean 124 can be performed in FIG. 6.

At 3020 of FIG. 30 an implant test 126 can be performed at an angle θ 127 as illustrated in the cross sectional view of FIG. 7, for a given apparatus 700 that is being tested for a given ion implantation system and the apparatus 700 as illustrated is also shown in a top view in FIG. 9, for example. In the present example, six of the pillars 120 are shown (e.g., numbers 1-6) with an angular ion beam 126, as illustrated. In this example, as described supra, the angular beam is shown directed at a clockwise angle θ 127 (e.g., from vertical). Under these conditions, pillar 6 (e.g., the right most pillar) will be the pillar with the greatest number of ions or dopant implanted 126 in a pillar first layer 118 (e.g., silicon), for example, whereas pillars 1-5 will be shielded from a portion of the ion implantation 126 by the pillar to their immediate right. In other words, pillar 5 is partially shielded by pillar 6; pillar 4 is partially shielded by pillar 5; and so on. Ions implanted into the second pillar layer 119 or the silicon dioxide insulating layer 102 does not change the resistivity of the pillars. Because the spacing is the same between the pillars in this example, after implantation 126 the resistivity of pillars 2 and 5 remains approximately equal, and the resistivity between 3 and 4 remains about equal, whereas the resistivity of pillars 1 and 6 is no longer equal and represents a function of the ion implantation angle θ 127. It should be appreciated that the photoresist, if left in place, prior to the implantation at 3020, the photoresist can be stripped at 3030, for example.

It should be noted however that because of scattering effects that are well known by those of skill in the art, there may be different readings at the center of the pillars, as opposed to pillars at the edges. This is true even after accounting for differences in the line lengths of the pillars. If the ion implantation was coming down from the top of the ion implanter in a vertical fashion there would be no difference in resistivity between the pairs of the pillars, for example. It should be appreciated that the number of pillars can be two or greater, the spacing between pillars can be non-equal and the lengths of pillars can be non-symmetrical, the pillar materials can vary from one pillar to another, and the like, and all such variations are contemplated herein. In addition, these pillars can be part of a test apparatus or part of an apparatus wafer, for example. At 3020 an optional anneal 128, for example, can be performed to repair any damage caused by the implantation (FIG. 8).

Once the test implantation 126 (FIG. 7) and an optional anneal 128 (FIG. 8) are performed at 3020, the resistivity of the various pillars can be measured and compared as a function of the angle of implantation. The resistivity measurements can be carried out using probe instruments and electrical test equipment that are well known by those of skill in the art. The resistivity measurements can be made one pillar at a time connecting to a single set of contacts, or with twelve pins that make contact with all of the contact pins at the same time in order to make six resistivity measurements simultaneously, manually or automatically, etc.

Approximately identical single mask angular measurement apparatus (e.g., apparatus (1), apparatus (2), apparatus (3), etc., like the apparatus illustrated in FIG. 7 would be placed successively into an ion implanter at "known" angles (e.g., −2, −1, 0, 1, 2 degrees) and the resistivity of the pillars in those apparatus would be measured to develop calibration curves for the ion implanter being tested, for example. It is also possible to measure the angles as a function of pillar resistivity using mathematical modeling as contemplated in this invention.

Figure 31:
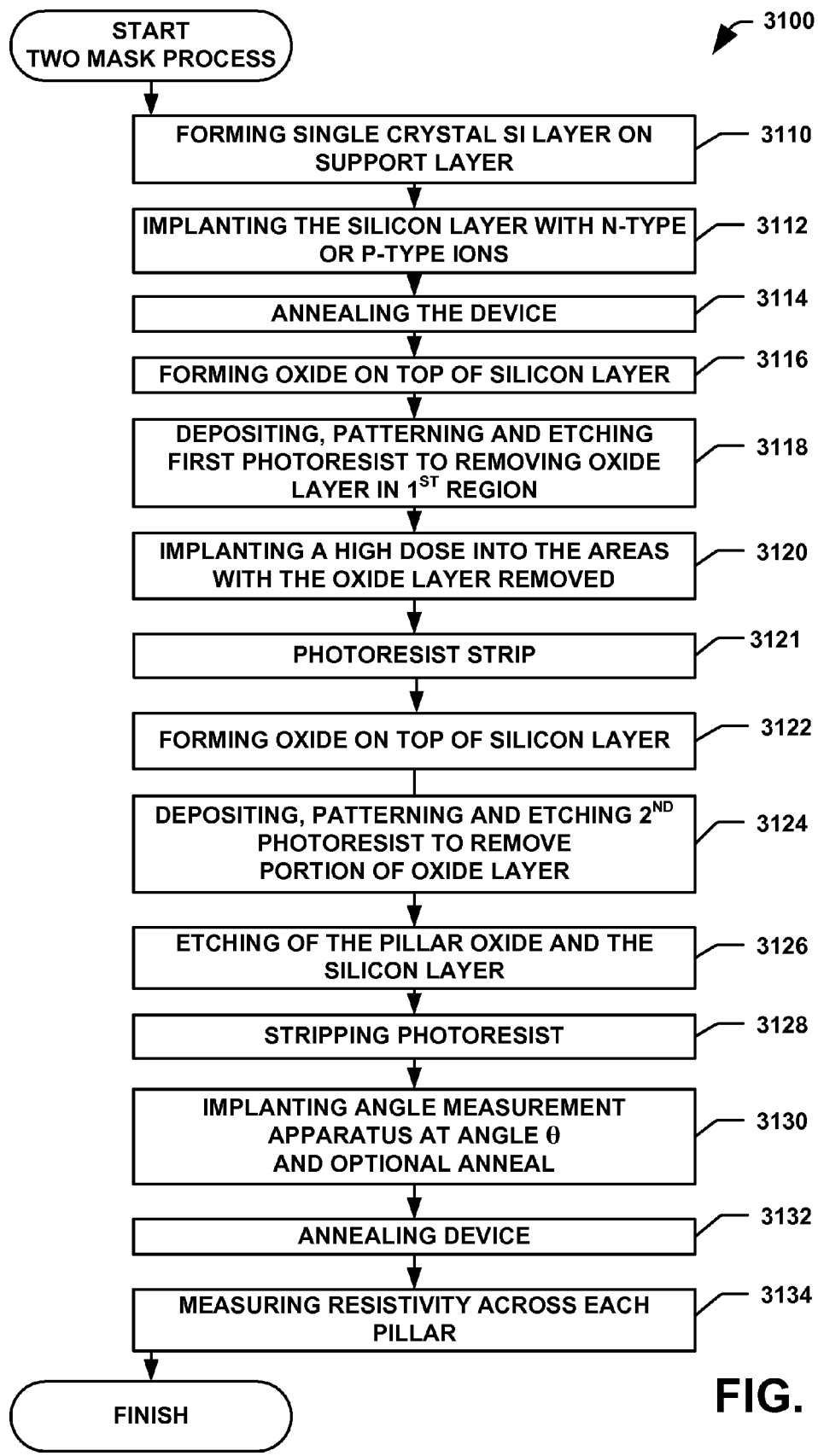
FIG. 31 is a flow diagram illustrating a method of fabricating an ion implantation angular measurement apparatus utilizing a two mask procedure in accordance with an aspect of the present invention.

FIG. 31 along with exemplary FIGS. 10-21 illustrate a two mask fabrication process for manufacturing an angular measurement apparatus according to yet another embodiment of the present invention. An advantage of the angular measurement apparatus formed with two masks is that it allows the top and bottom probe pads and leads to be doped more heavily than the pillars within the middle section of the apparatus which remains lightly doped. This may be necessary for testing low and mid-dose implantations, where the pads must be heavily doped to make a low contact resistance, but the pillars can be lightly doped to adequately detect the implantation angle under test. This will be discussed in detail the following discussion.

The method 3100 begins at 3110 with forming a single crystal silicon layer 1004 on a support layer 1002. Together the single crystal silicon layer 1004 and the support layer 1002 can be referred to as a workpiece 1008, as illustrated in FIG. 11. At 3112 of FIG. 31 an ion implantation 1006 is illustrated in FIG. 11, utilizing an ion beam, having a number of characteristics including, dopant type, dose, beam current, angle of incidence, energy, and the like. The single crystal silicon layer 1004 can be implanted with n-type or p-type ions. Although the ion implantation 1006 is depicted as being substantially orthogonal to a surface of the silicon layer 1004, the implantation 1006 can be at other incident angles with respect to the surface of the silicon layer 1004. Ion implantation is well known by those of skill in the art. The apparatus in FIG. 10-21 can also be built up on "ready made" silicon-on-insulator workpiece, for example.

It should be appreciated that platen or electrostatic chuck (not shown) holds the handle substrate (not shown) and the platen is operable to move the workpiece 1008 through the ion beam at a controlled rate, for example, so as to achieve desired implantation results. Generally, the ion implantation 1006 is performed in multiple passes of the workpiece 1008 through the ion beam. By so doing, a substantially uniform implantation 1006 across the workpiece 1008 can be obtained because all parts or portions of the workpiece 1008 move through the ion beam at about the same rate.

An anneal 1007 can be performed at 3114 after the implantation 1006 to repair any damage caused by the implantation 1006, for example. Annealing processes are well known by those of skill in the art. In FIG. 31 at 3116, an oxide layer 1010 can be formed on top of the single crystal silicon layer 1004 employing thermal oxidation or deposition, for example. The formation of the oxide layer 1010 is well known by those of skill in the art.

At 3118, of FIG. 31 photoresist 1012 can be deposited on the oxide layer 20 1010 using a masking process, for example, on a partial ion implantation angle measurement apparatus 1300 illustrated in FIG. 13. The photoresist 1012 can then be exposed 1014 and etched 1016, as illustrated at 3118, for example. The photolithographic process is carried out to remove a portion of the oxide 1010 and a portion of the silicon layer 1004. The oxide 1010 in the first region (1020 and 1023 (FIG. 21)), as illustrated. The process of photolithography in semiconductor apparatus manufacturing is well known by those of skill in the art.

At 3120, of FIG. 31 implanting a high dose into a first region 1020 and second region 1023 (FIG. 21)) wherein the oxide layer 1010 has been removed is performed. FIG. 21 illustrates a partial ion implantation angle measurement apparatus 2100 where a pillar first layer 1018 (FIG. 18) of the pillars 120 (e.g., pillars numbered 1-6) can be made out of the single crystal silicon layer 104 (FIG. 19), for example. FIG. 14 illustrates a partial measurement apparatus 1400 with a portion of the first photoresist layer 1012 and a portion of the oxide layer 1010 removed 1015. The process at 3118 can use any photolithographic process that is well known to those of skill in the art.

Contact pads 1021 (e.g., pads numbered 1C-6C and 1D-6D) and leads within regions 1020 and 1023 must be heavily doped to make low resistance contacts pads 1021. A third region 1018, (FIG. 21) is covered with a mask during the high dose ion implantation 1019 (FIG. 16) to prevent doping in that region 1018.

It is to be appreciated that any number of pillars, two or greater can be utilized in forming an angular measurement apparatus, of various widths, spacings, heights, materials, number of pillar layers, angular orientation on the workpiece, etc., and all are contemplated and embodied within this invention. After the first photoresist 1012 is stripped 1017 in FIG. 15 an optional standard clean can be performed. In FIG. 17 as illustrated at 3124 of method 3100, a second photoresist 1020 can be deposited, patterned and etched 1021 on an oxide layer 1010. As illustrated in FIG. 18 pillars 7-12 are now formed on the insulating layer 1002 comprising, a first pillar layer 1018 made of silicon and a second pillar layer 1010 made of oxide, for example. A second photoresist layer 1020 (i.e., second mask) can be removed or stripped 1025 at 3124 after the etching of the oxide and silicon 1023 down to the insulating layer 1002 at 3126 of FIG. 31.

At 3130 of FIG. 31 an ion implantation 1031 (e.g., the characterization implant) can be performed at an angle as illustrated in the cross sectional view of FIG. 19, for a given apparatus 1900 that is being tested for a given ion implantation system and the apparatus 1900 as illustrated is also shown in a top view in FIG. 21, for example. In the present example, six of the pillars are shown (e.g., numbers 1-6) with an angular ion beam 1031, as illustrated. In this example, as described supra, the angular beam is shown directed at a clockwise angle (e.g., from vertical). Under these conditions, pillar 6 (e.g., the right most pillar) will be the pillar with the greatest number of ions or dopant implanted 1031 in a pillar first layer 118 (e.g., silicon), for example, whereas pillars 1-5 will be shielded from a portion of the ion implantation 1031 by the pillar to their immediate right. An optional anneal 1033 at 3132 can be performed as illustrated in FIG. 20 to repair any damage caused by the ion implantation test 1031 (FIG. 19).

Approximately identical two mask angular measurement apparatus (e.g., apparatus (1), apparatus (2), apparatus (3), etc., like the apparatus illustrated in FIG. 7 would be placed successively into an ion implanter at "known" angles (e.g., −2, −1, 0, 1, 2 degrees) and the resistivity of the pillars in those apparatus would be measured to develop calibration curves for the ion implanter being tested, for example. It is also possible to measure the angles as a function of pillar resistivity using mathematical modeling as contemplated in this invention.

Figure 32:
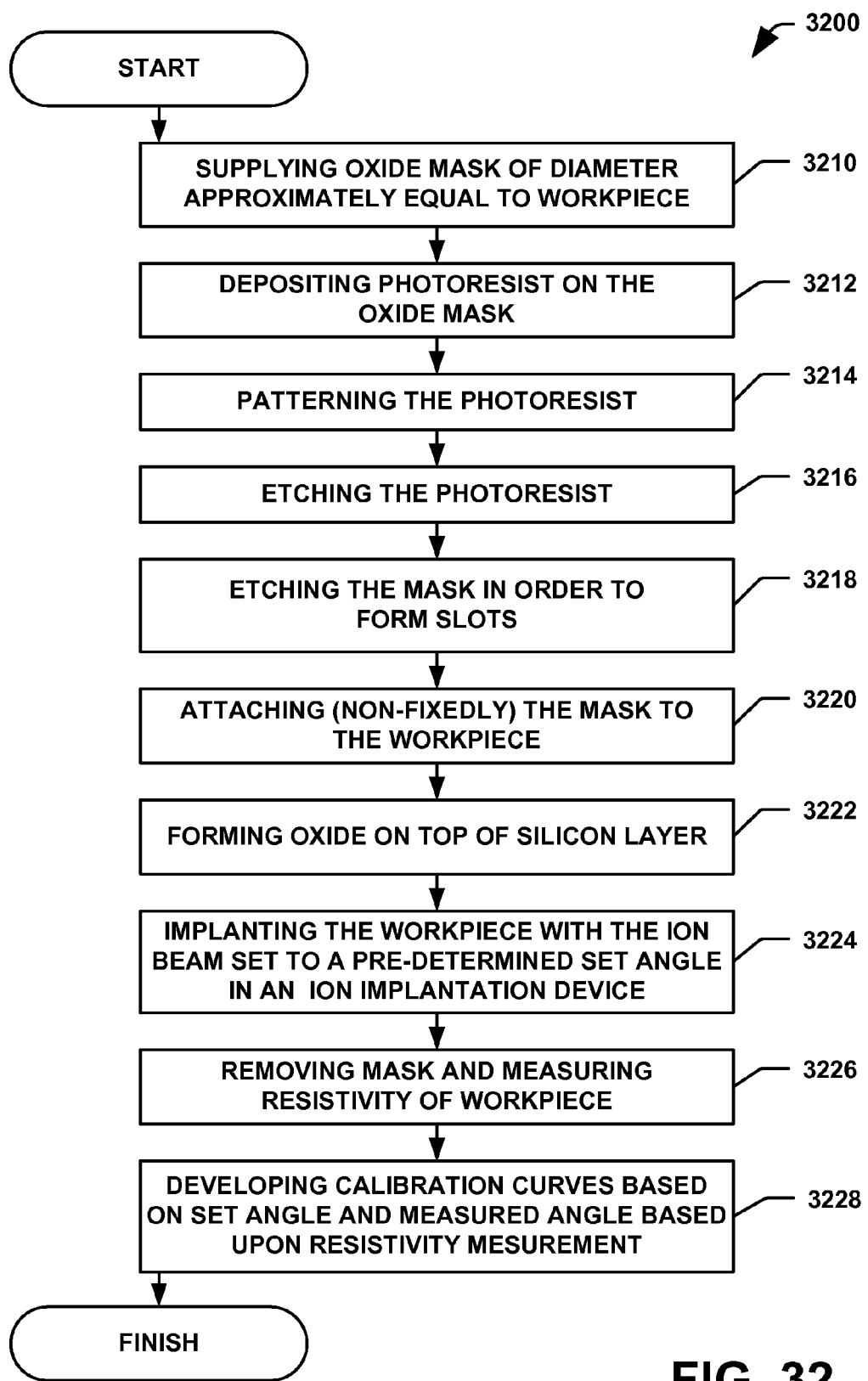
FIG. 32 is a flow diagram illustrating a method of fabricating an ion implantation angular measurement apparatus in accordance with an aspect of the present invention.

FIG. 32 illustrates an exemplary method 3200 of forming an ion implantation angle measurement apparatus 2200 (FIG. 22) according to the present invention. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the apparatus and systems illustrated and described herein as well as in association with other systems not illustrated.

The method 3200 begins with supplying an oxide mask of diameter approximately equal to workpiece at 3210. An exemplary result of performing method 3200 is illustrated in FIGS. 22 and 23. FIG. 22 illustrates a top view of an exemplary ion implantation angle measurement apparatus 2200 having slots 2208. A high aspect ratio external mask 2202 can be held or clamped to a workpiece 2302 (FIG. 23) that is non-fixedly attached to a platen using an electrostatic chuck, a clip 2204 and bolt 2206 arrangement as shown, or any suitable arrangement for holding down the workpiece 2302 (FIG. 23). A photoresist is deposited over the surface of the mask 2200 at 3212 wherein a masking pattern at 3212 can be created associated therewith. As will be understood by one of ordinary skill in the art, the photoresist is then exposed to a predetermined wavelength of radiation through a masking reticle (not shown), and developed in a conventional developing solution to form the slots 2208 illustrated in FIGS. 22 and 23 utilizing an etching process at 3216, for example. The slots 2208 are further etched into the mask at 3218 and are further characterized by a width and a length and the slots 2208 create openings in the mask 2300, as illustrated in FIG. 23.

At 3220 the mask 2202 can be non-fixedly attached to a workpiece 2302 (FIG. 23) utilizing fasteners, clamps, and the like. At 3222 the workpiece can be implanted with an ion beam set to a pre-determined angle on the implanter. At 3226 the mask can be removed from the workpiece 2302 and the resistivity of the workpiece can be measured using a four point probe, for example. At 3228 calibration curves can be developed based upon the set angle and the angle based upon the measured resistivity.

It is appreciated that alternate aspects of the invention include any suitable number of pillars located at other positions, and with other aspect ratios and materials is contemplated herein.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, apparatus, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. An ion beam angular measurement apparatus, comprising:
   an arrangement of composite pillars formed on an insulating layer, wherein the composite pillars comprise:
   a first layer formed on the insulating layer;
   a second layer formed on the first layer; and
   a pad contact formed at each end of the composite pillar, wherein the composite pillars selectively allow ion beams to penetrate the first layer of a pillar, and wherein resistivity measurements are taken for each of the composite pillars before and after a test ion beam implantation, wherein the resistivity measurements yield information relating to an angle of the ion beam during the test ion beam implantation.

2. The apparatus of claim 1, wherein the composite pillars are equally spaced apart.

3. The apparatus of claim 1, wherein the composite pillars are approximately equally dimensioned.

4. The apparatus of claim 1, wherein identically fabricated copies of the ion beam angular measurement apparatus are configured to be placed successively into an ion implanter at known angles, and wherein the resistivity of the pillars in each apparatus generally determines calibration curves for an ion implanter utilized for the test ion beam implantation.

5. The apparatus of claim 1, wherein the pad contacts at each end of the composite pillars are configured to be contacted by a test probe.

6. The apparatus of claim 1, wherein the pad contacts at each end of the composite pillars comprise heavily doped portions of the first layer, wherein a resistivity of the first and second contact pads is minimal.

7. The apparatus of claim 1, wherein the insulating layer comprises a silicon dioxide layer.

8. The apparatus of claim 1, wherein the first layer comprises silicon or polysilicon.

9. The apparatus of claim 1, wherein the substrate comprises a silicon substrate.

10. The apparatus of claim 1, wherein the second layer comprises an oxide.

11. An ion beam angular measurement apparatus, comprising:
    an insulating layer provided over a semiconductor substrate; and
    a plurality of pillars formed on the insulating layer, wherein the plurality of pillars each comprise at least a first layer formed on the insulating layer, and wherein the first layer is configured to selectively allow penetration of an ion beam therein, wherein after the penetration of the ion beam into the first layer, a resistivity of each of the plurality of pillars is associated with an angle of the ion beam with respect to the semiconductor substrate.

12. The ion beam angular measurement apparatus of claim 11, wherein the insulating layer comprises a silicon dioxide layer.

13. The ion beam angular measurement apparatus of claim 11, wherein the first layer comprises silicon or polysilicon.

14. The ion beam angular measurement apparatus of claim 11, wherein the substrate comprises a silicon substrate.

15. The ion beam angular measurement apparatus of claim 11, wherein the plurality of pillars each further comprise a second layer formed on the first layer.

16. The ion beam angular measurement apparatus of claim 15, wherein the second layer comprises an oxide.

17. The ion beam angular measurement apparatus of claim 11, wherein each of the plurality of pillars comprise first and second contact pads positioned at a respective first end and second end each pillar, wherein the first and second contact pads of each of the plurality of pillars are configured for measuring the resistivity of each of the respective plurality of pillars.

18. The ion beam angular measurement apparatus of claim 17, wherein the first and second contact pads of each of the plurality of pillars comprise heavily doped portions of the first layer, wherein a resistivity of the first and second contact pads is minimal.

19. The ion beam angular measurement apparatus of claim 11, wherein the resistivity of each of the plurality of pillars is further a function of a spacing between the plurality of pillars.

20. An ion beam angular measurement apparatus, comprising:
   an insulating layer provided over a semiconductor substrate; and
   a plurality of pillars formed on the insulating layer, wherein the plurality of pillars each comprise a first layer and a second layer, wherein the first layer is formed on the insulating layer and the second layer formed on the first layer, and wherein the first layer is configured to selectively allow penetration of an ion beam into the first layer, wherein after the penetration of the ion beam into the first layer, a resistivity of each of the plurality of pillars is associated with an angle of the ion beam with respect to the semiconductor substrate.

21. The ion beam angular measurement apparatus of claim 20, wherein the insulating layer comprises a silicon dioxide layer.

22. The ion beam angular measurement apparatus of claim 20, wherein the first layer comprises silicon or polysilicon, and wherein the second layer comprises silicon dioxide.

23. The ion beam angular measurement apparatus of claim 20, wherein the second layer comprises an oxide.

24. The ion beam angular measurement apparatus of claim 20, wherein each of the plurality of pillars comprise first and second contact pads positioned at a respective first end and second end each pillar, wherein the first and second contact pads of each of the plurality of pillars are configured for measuring the resistivity of each of the respective plurality of pillars.

25. The ion beam angular measurement apparatus of claim 24, wherein the first and second contact pads of each of the plurality of pillars comprise heavily doped portions of the first layer, wherein a resistivity of the first and second contact pads is minimal.

* * * * *